United States Patent
Park et al.

(10) Patent No.: US 11,374,300 B2
(45) Date of Patent: Jun. 28, 2022

(54) DIRECTIONAL COUPLER AND ELECTRONIC DEVICE HAVING THE SAME

(71) Applicant: Samsung Electronics Co., Ltd., Gyeonggi-do (KR)

(72) Inventors: Jonghyun Park, Gyeonggi-do (KR); Dongil Yang, Gyeonggi-do (KR); Jihee Kang, Gyeonggi-do (KR); Youngjoon Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 85 days.

(21) Appl. No.: 16/848,438

(22) Filed: Apr. 14, 2020

(65) Prior Publication Data

US 2020/0328492 A1    Oct. 15, 2020

(30) Foreign Application Priority Data

Apr. 15, 2019  (KR) .................. 10-2019-0043972

(51) Int. Cl.
  *H01P 5/18*    (2006.01)
  *H05K 1/02*    (2006.01)

(52) U.S. Cl.
  CPC ............. *H01P 5/184* (2013.01); *H05K 1/024* (2013.01)

(58) Field of Classification Search
  CPC .................. H01P 1/184–187; H05K 1/024
  See application file for complete search history.

(56) References Cited

U.S. PATENT DOCUMENTS

| | | | |
|---|---|---|---|
| 6,686,812 B2 * | 2/2004 | Gilbert | H01P 5/185 333/112 |
| 8,400,307 B2 * | 3/2013 | Kataya | H05K 1/141 343/726 |
| 8,536,956 B2 * | 9/2013 | Tamaru | H01P 5/18 333/112 |

(Continued)

FOREIGN PATENT DOCUMENTS

| | | |
|---|---|---|
| KR | 1020090069411 | 7/2009 |
| WO | WO 2014/050623 | 4/2014 |
| WO | WO 2018/079614 | 5/2018 |

OTHER PUBLICATIONS

International Search Report dated Jul. 22, 2020 issued in counterpart application No. PCT/KR2020/005039, 8 pages.

(Continued)

*Primary Examiner* — Dean O Takaoka
*Assistant Examiner* — Alan Wong
(74) *Attorney, Agent, or Firm* — The Farrell Law Firm, P.C.

(57) ABSTRACT

A directional coupler according to various embodiment and an electronic device having the same are provided. The directional coupler includes a first layer having at least one conductive portion, a second layer disposed adjacent to the first layer in a first direction and having at least one conductive plate corresponding to the conductive portion of the first layer, a third layer disposed adjacent to the second layer in the first direction and including an RF signal transmission line, a fourth layer disposed adjacent to the third layer in the first direction and having a conductive line wound with at least one turn, and at least one conductive via electrically connecting the at least one conductive plate of the second layer and the conductive line of the fourth layer which is wound with at least one turn.

20 Claims, 14 Drawing Sheets

(56) References Cited

U.S. PATENT DOCUMENTS

| | | | |
|---|---|---|---|
| 9,000,864 B2* | 4/2015 | Tanaka | H01P 5/184 |
| | | | 333/116 |
| 9,685,688 B2* | 6/2017 | Katabuchi | H01P 5/184 |
| 10,714,806 B2* | 7/2020 | Ootsuka | H03H 7/38 |
| 10,892,538 B2* | 1/2021 | Hanaoka | H01P 5/187 |
| 2013/0141184 A1 | 6/2013 | Tamaru et al. | |
| 2017/0040661 A1 | 2/2017 | Ashida et al. | |
| 2018/0062235 A1 | 3/2018 | Lyu et al. | |
| 2018/0316334 A1 | 11/2018 | Na et al. | |
| 2019/0006729 A1 | 1/2019 | Tamaru | |
| 2019/0067784 A1 | 2/2019 | Yasuda | |
| 2019/0237843 A1 | 8/2019 | Hanaoka | |

OTHER PUBLICATIONS

European Search Report dated Mar. 24, 2022 issued in counterpart application No. 20791855.8-1205, 8 pages.

* cited by examiner

DIRECTIONAL COUPLER AND ELECTRONIC DEVICE HAVING THE SAME

CROSS-REFERENCE TO RELATED APPLICATION(S)

This application is based on and claims priority under 35 U.S.C. § 119 to Korean Patent Application No. 10-2019-0043972, filed on Apr. 15, 2019, in the Korean Intellectual Property Office, the disclosure of which is incorporated herein by reference in its entirety.

BACKGROUND

1. Field

The present disclosure relates to a directional coupler, and an electronic device having the same.

2. Description of Related Art

Electronic devices can perform communication with a base station, providing a wireless communication network via communication components included in the electronic devices. In recent years, the electronic devices have been made smaller and thinner, and/or have been integrated, and band frequencies utilized by the communication components included in the electronic devices have been gradually made higher and narrower.

Among the communication components included in the electronic devices, a directional coupler is for dividing transmitted signals at a fixed ratio. For example, the directional coupler samples a fixed amount of signals from output emitted from an amplifier of a transmitting end of a wireless communication circuit, and transmits the sampled signals to an automatic output regulator, and thereby always enables output having a fixed magnitude to serve to be transmitted to the outside via an antenna.

The conventional directional coupler is usually mounted on a surface of a board included in the electronic device. For example, a plurality of electronic parts can be mounted on the board of the electronic device, and the directional coupler can also be mounted on the surface of the board. When the directional coupler is mounted on the surface of the board, the directional coupler occupies an internal space of the electronic device in proportion to a volume thereof. To protect the directional coupler from an electromagnetic influence of external electronic parts, the electronic device may additionally include a shield can that covers the directional coupler. Sampling accuracy using the directional coupler can be increased, but the internal space of the electronic device can be further reduced.

The directional coupler may include passive elements such as a capacitor or an inductor. When the capacitor or the inductor is installed on the board, the capacitor or the inductor occupies a considerable internal space of the electronic device, and thus it may be difficult for the electronic device to be made smaller and thinner, and/or to be integrated.

Further, the directional coupler outputs a signal coupled to a signal input through an input terminal of the communication circuit. If isolation is not sufficiently secured in this process, this can have a bad influence on communication performance. The isolation of the directional coupler can be determined on the basis of the structural aspect according to arrangement between conductors and dielectrics that constitute the directional coupler, and thus the arrangement of the components included in the directional coupler can become an important factor in determining performance.

SUMMARY

The present disclosure has been made to address at least the disadvantages described above and to provide at least the advantages described below.

According to various embodiments of the disclosure, a directional coupler embedded in a board to secure spatial efficiency in an electronic device and an electronic device having the same can be provided.

According to various embodiments of the disclosure, a printed circuit board performing a function of a directional coupler can be provided.

According to various embodiments of the disclosure, a directional coupler that can have excellent insertion loss characteristics can be provided.

According to various embodiments of the disclosure, a directional coupler that can have an excellent isolation characteristic in a state embedded in a board can be provided.

According to various embodiments of the disclosure, passive elements such as a capacitor and an inductor are formed on a board, and thereby a space which the passive elements occupy as they are mounted on the board can be reduced to increase spatial efficiency. As another effect produced by disposing the passive elements on the board, an effect capable of assuring the durability of a product from physical impacts applied to an electronic device from the outside or damage to components in the event of falling and assembling/disassembling can be produced.

According to various embodiments of the disclosure, a directional coupler of a new structure which has excellent insertion loss characteristics and an excellent isolation characteristic and can support a wideband, and a printed circuit board that realizes the directional coupler can be provided.

In accordance with an aspect of the present disclosure, a directional coupler is provided. The coupler includes a first layer configured to include at least one conductive portion, a second layer disposed adjacent to the first layer in a first direction and configured to include at least one conductive plate that overlaps the at least one conductive portion of the first layer, a third layer disposed adjacent to the second layer in the first direction and configured to include at least one RF signal transmission line, a fourth layer disposed adjacent to the third layer in the first direction and configured to include a conductive line that is wound with at least one turn, and at least one conductive via configured to electrically connect the at least one conductive plate of the second layer and the conductive line of the fourth layer which is wound with at least one turn. The first layer, the second layer, the third layer, and the fourth layer are configured to form at least a part of a printed circuit board.

In accordance with an aspect of the present disclosure, an electronic device is provided. The electronic device includes at least one board, at least one antenna, a transceiver, a directional coupler configured to extract at least some of signals output from the at least one antenna and to transmit a coupling signal to the transceiver, a processor and a memory operatively connected to the processor. The directional coupler includes a first layer that includes at least one conductive portion, a second layer that is disposed adjacent to the first layer in a first direction and includes at least one conductive plate that at least partly overlaps the at least one conductive portion of the first layer, a third layer that is disposed adjacent to the second layer in the first direction and includes at least one RF signal transmission line, a fourth layer that is disposed adjacent to the third layer in the first direction and includes a conductive line that is wound with at least one turn, and at least one conductive via configured to electrically connect the at least one conductive plate of the second layer and the conductive line of the fourth layer which is wound with at least one turn. The first layer, the second layer, the third layer, and the fourth layer are configured to form at least a part of the at least one board.

In accordance with an aspect of the present disclosure, a printed circuit board is provided. The printed circuit board includes a first layer configured to include at least one conductive portion, a second layer disposed adjacent to the first layer in a first direction and configured to include at least one conductive plate that at least partly overlaps the at least one conductive portion of the first layer, a third layer disposed adjacent to the second layer in the first direction and configured to include at least one RF signal transmission line, a fourth layer disposed adjacent to the third layer in the first direction and configured to include a conductive line that is wound with at least one turn, and at least one conductive via configured to electrically connect the at least one conductive plate of the second layer and the conductive line of the fourth layer which is wound with at least one turn.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
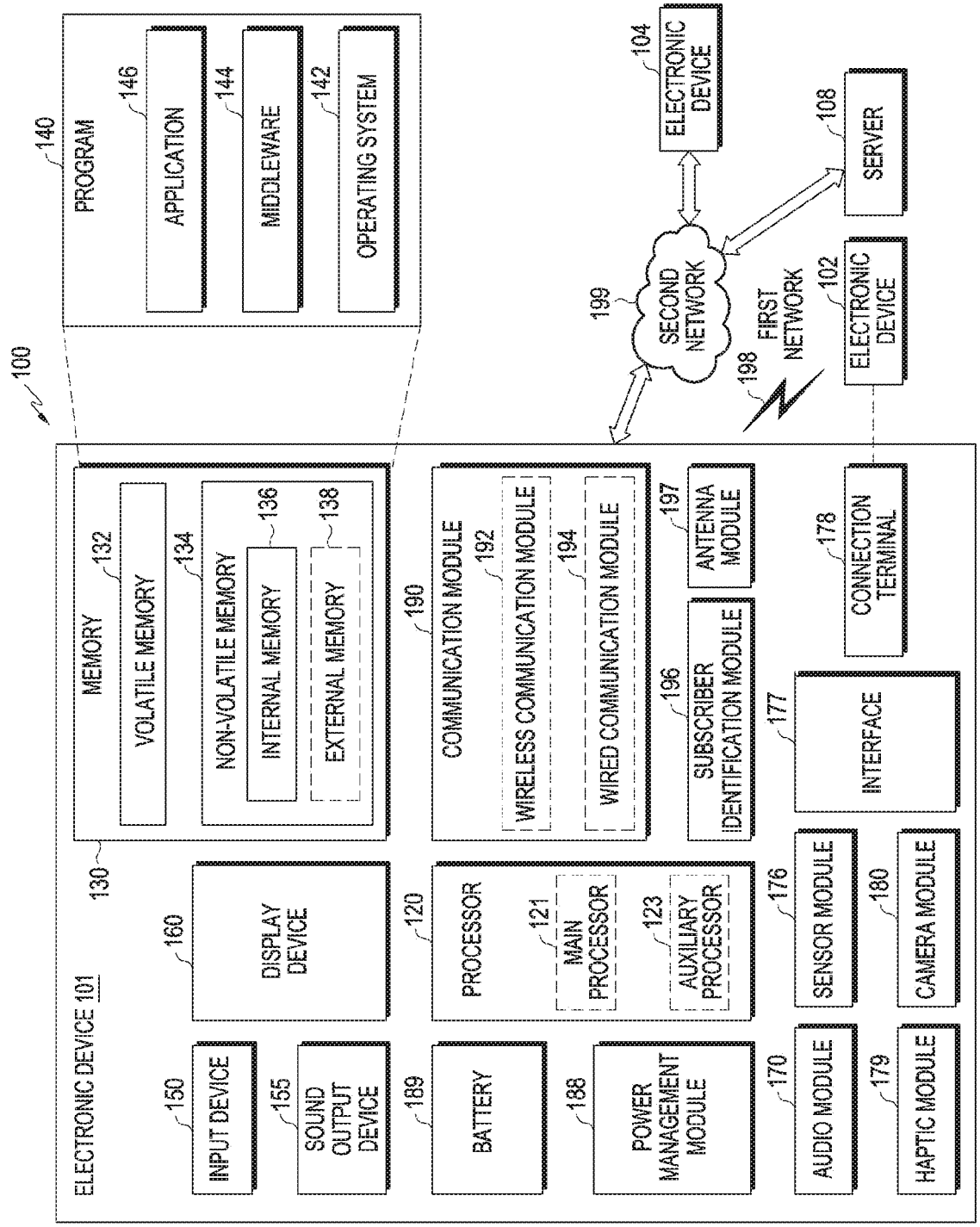
FIG. 1 is a block diagram illustrating an electronic device in a network environment, according to an embodiment.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
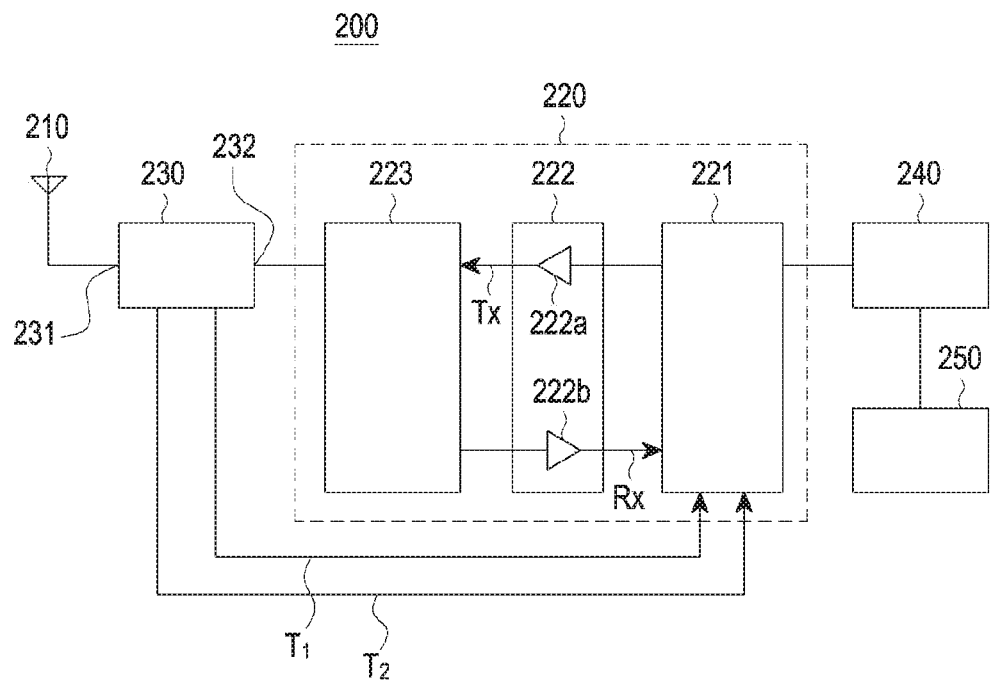
FIG. 2 is a block diagram of an antenna, a wireless communication circuit, and peripherals thereof included in the electronic device, according to an embodiment.

FIG. 2 is a block diagram of an antenna, a wireless communication circuit, and peripherals thereof included in the electronic device, according to an embodiment.

Referring to FIG. 2, the electronic device 200 may include, for instance, all or some of the components of the electronic device 101 illustrated in FIG. 1.

The electronic device 200 may include at least one antenna 210, a wireless communication circuit 220 (e.g., the communication module 190 of FIG. 1), a directional coupler 230, a processor 240 (e.g., the processor 120 of FIG. 1) and/or a memory 250 (e.g., the memory 130 of FIG. 1). The wireless communication circuit 220 may include a transceiver 221, a power amplifier module 222, and/or a front end module 223.

The transceiver 221 may convert data received from the processor 240 to an RF signal (e.g., a transmitter (Tx) signal), and output it to the front end module 223 through the power amplifier module 222 (e.g., a power amplifier (PAM)). Further, the transceiver 221 may convert an RF signal (e.g., a receiver (Rx) signal) received from the front end module 223 to a decodable digital data, and transmit it to the processor 240.

The power amplifier module 222 may include a power amplifier 222a, or a low-noise amplifier 222b. The power amplifier 222a may amplify an RF signal (e.g., a Tx signal) received from the transceiver 221, and transmit it to the front end module 223. The low-noise amplifier 222b may amplify an RF signal (e.g., an Rx signal) received from the at least one antenna 210 through the front end module 223 while minimizing noise, and transmit it to the transceiver 221. An amplification factor of the power amplifier 222a or the low-noise amplifier 222b may be determined by a magnitude of an energy source thereof (e.g., a voltage or a current). The processor 240 adjusts a magnitude of a power supply (a voltage or a current), and thereby the amplification factor can be changed.

The front end module 223 may perform power dividing. The front end module 223 may serve to divide power among at least two or more antennas. The front end module 223 may perform signal dividing. The front end module 223 may divide and output a transmitted/received signal. The front end module 223 may output the RF signal (e.g., the Tx signal) received from the transceiver 221 to the at least one antenna 210, and output the RF signal (e.g., the Rx signal) received from the at least one antenna 210 to the transceiver 221.

The directional coupler 230 may perform power extraction. The directional coupler 230 may extract, from the RF signal output from the at least one antenna 210, a forward coupling signal T1 having the same waveform and power lower than power of the RF signal (e.g., −30 dBm in a case where the power of the RF signal is 0 dBm), and transmit it to the transceiver 221. Meanwhile, due to an impedance difference between the at least one antenna 210 and the front end module 223, the RF signal may not be radiated through the at least one antenna 210 without a change (without a power loss), and be subjected to a return loss between the at least one antenna 210 and the front end module 223. If the RF signal is output to the at least one antenna 210 from the front end module 223, a reflected signal may be generated by the impedance difference between the at least one antenna 210 and the front end module 223, and be transmitted to the front end module 223.

The directional coupler 230 may extract, from this reflected signal, a reverse coupling signal T2 having the same waveform and power lower than power of the reflected signal (e.g., −30 dBm in a case where the power of the reflected signal is 0 dBm), and transmit it to the transceiver 221. The directional coupler 230 may transmit a signal received through the at least one antenna 210 along with a signal that is not output and is reflected by the at least one antenna 210 to the transceiver 221 through the reverse coupling signal T2. The transceiver 221 may output values (e.g., a power value and a voltage value), which correspond to the forward coupling signal T1 and the reverse coupling signal T2, to the processor 240.

The directional coupler 230 may include a first port 231 and a second port 232. The first port 231 and the second port 232 may respectively correspond to an RF input port and an RF output port, or may respectively correspond to the RF output port and the RF input port. When the directional coupler 230 receives the RF signal from the at least one antenna 210, the first port 231 may be the RF input port, and the second port 232 may be the RF output port. When the directional coupler 230 receives the RF signal from the front end module 223, the second port 232 may be the RF input port, and the first port 231 may be the RF output port.

Load impedance between the at least one antenna 210 and the directional coupler 230 may have a prescribed difference from characteristic impedance of the directional coupler 230. An impedance tuning circuit (an impedance matching circuit) that regulates the load impedance to be as close as possible to the characteristic impedance may be additionally provided.

The processor 240 may include one or more of a CPU, an AP, or a CP. The processor 240 may be, for instance, a device that executes operations or data processing relevant to control and/or communication of at least one or more other components of the electronic device 200. The processor 240 may be electrically connected to the other components (e.g., the transceiver 221, the power amplifier module 222, and/or the directional coupler 230), may control the other components, and may perform various data processing and operations.

The memory 250 may be operatively connected to the processor 240. When executed, the memory 250 may store instructions to cause the processor to control the other components (e.g., the transceiver 221, the power amplifier module 222, and/or the directional coupler 230) to which the processor is electrically connected, and to perform various data processing and operations. The memory 250 may store a compensation value for regulating the load impedance to be as close as possible to the characteristic impedance.

The processor 230 may calculate a reflection coefficient of the antenna 210 using the values that correspond to the forward coupling signal T1 and the reverse coupling signal T2 and are received from the transceiver 221, and obtain a phase value. The processor 240 may compare the obtained phase value with, for instance, a reference value (reference phase information) recorded in a look-up table of the memory 250, and obtain a phase difference (e.g., a phase difference from a reference set). The phase difference (e.g., a RF performance deflection from the reference set) may be compensated by various embodiments.

Figure 3:
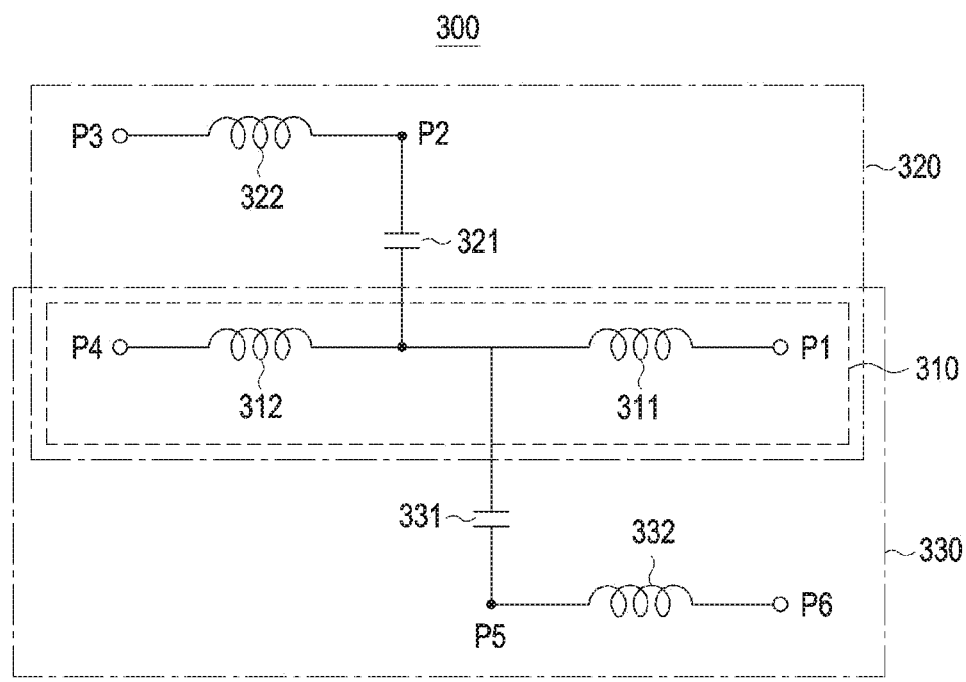
FIG. 3 is a diagram of a circuit of a directional coupler, according to an embodiment.

FIG. 3 is a diagram of a circuit of a directional coupler, according to an embodiment.

A directional coupler 300 (e.g., the directional coupler 230 of FIG. 2) may be configured to use coupling that is a phenomenon in which alternating current signal energy is mutually transmitted between independent spaces or lines in an electromagnetic way.

As mentioned in FIG. 2, the directional coupler 230 performs the power extraction, and the front end module 223 serves to perform the power dividing. However, the directional couplers 300, 400, 500, 600, 700, and 800 to be described below including the embodiment illustrated in FIG. 3 may include a directional coupler that can serve to perform the power extraction as well as the power dividing.

The directional coupler 300 may include a uni-directional coupler, or a bi-directional coupler in accordance with the embodiment.

Referring to FIG. 3, the directional coupler 300 may include an RF in/out line 310. The directional coupler 300 may be configured to be able to be coupled to the RF in/out line 310, and may include a first directional coupler 320 and a second directional coupler 330.

The uni-directional coupler may include one selected from the first directional coupler 320 or the second directional coupler 330.

In contrast, the bi-directional coupler may include the first directional coupler 320 and the second directional coupler 330. The first directional coupler 320 and the second directional coupler 330 may share the single RF in/out line 310.

The RF in/out line 310 may include an RF input port P1 and an RF output port P4, and may include at least one of passive elements (e.g., inductors 311 and 312) between the RF input port P1 and the RF output port P4. The first directional coupler 320 may include a capacitor 321 between the RF in/out line 310 and a first coupling port P2, and an inductor 322 between the first coupling port P2 and a first terminal port P3. The capacitor 321 and the inductor 322 included in the first directional coupler 320 may be electro-magnetically connected to an RF signal transmitted along the RF in/out line 310, and generate a coupling signal (e.g., the forward coupling signal T1 and/or the reverse coupling signal T2).

The second directional coupler 330 may include a capacitor 331 between the RF in/out line 310 and a second coupling port P5, and an inductor 332 between the second coupling port P5 and a second terminal port P6. The capacitor 331 and the inductor 332 included in the second directional coupler 330 may be electro-magnetically connected to the RF signal transmitted along the RF in/out line 310, and generate a coupling signal. Hereinafter, for the sake of convenience, the description will be made using the bi-directional coupler that shares the single RF in/out line 310 as illustrated in FIG. 3. However, note that the scope of the disclosure is not necessarily limited thereto.

A structure of a directional coupler in which the components included in the directional coupler 300 illustrated in FIG. 3 are embedded in a board may be disclosed.

Figure 4:
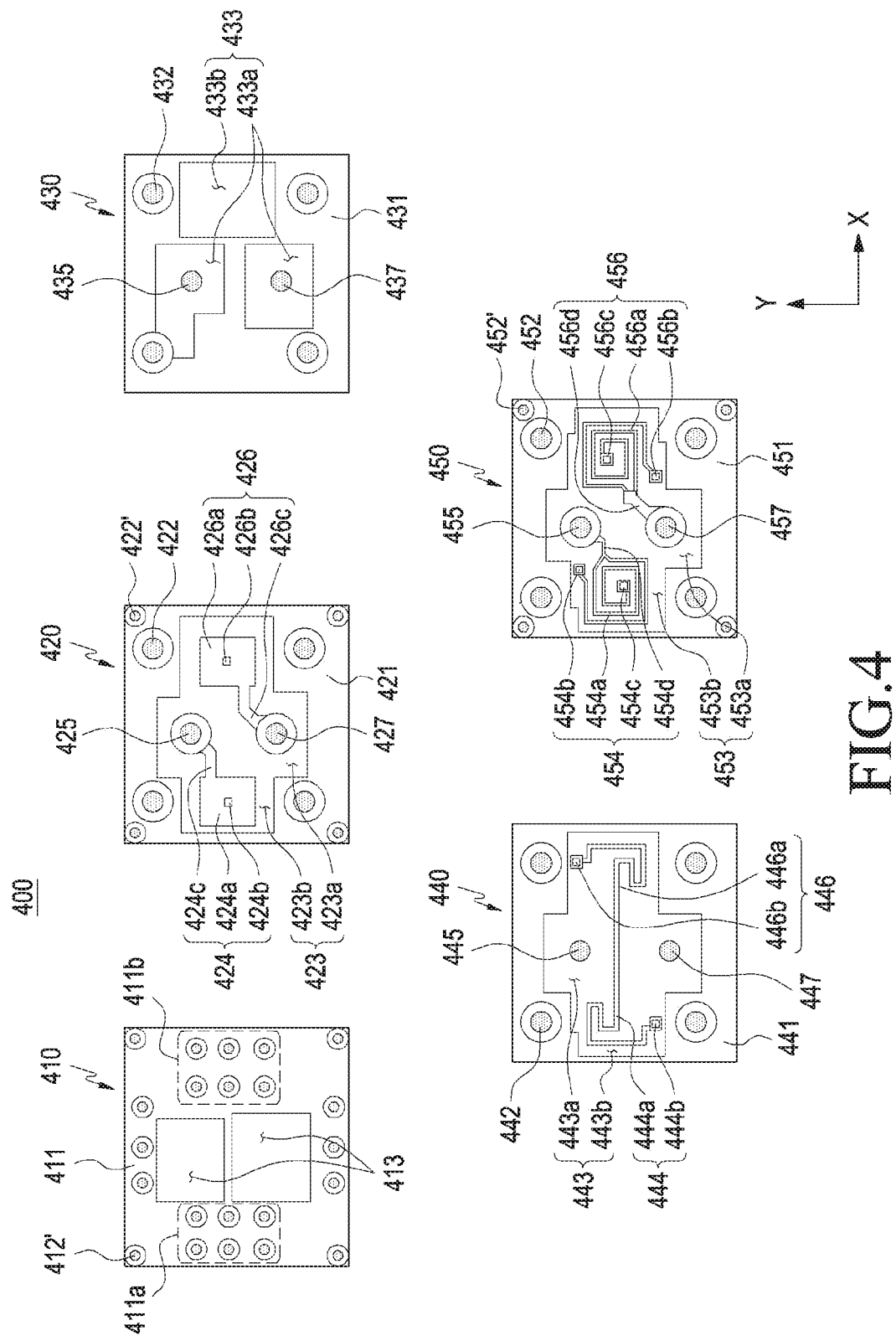
FIG. 4 is a top view diagram of structures of layers of a directional coupler embedded in a multilayer board, according to an embodiment.
Figure 5:
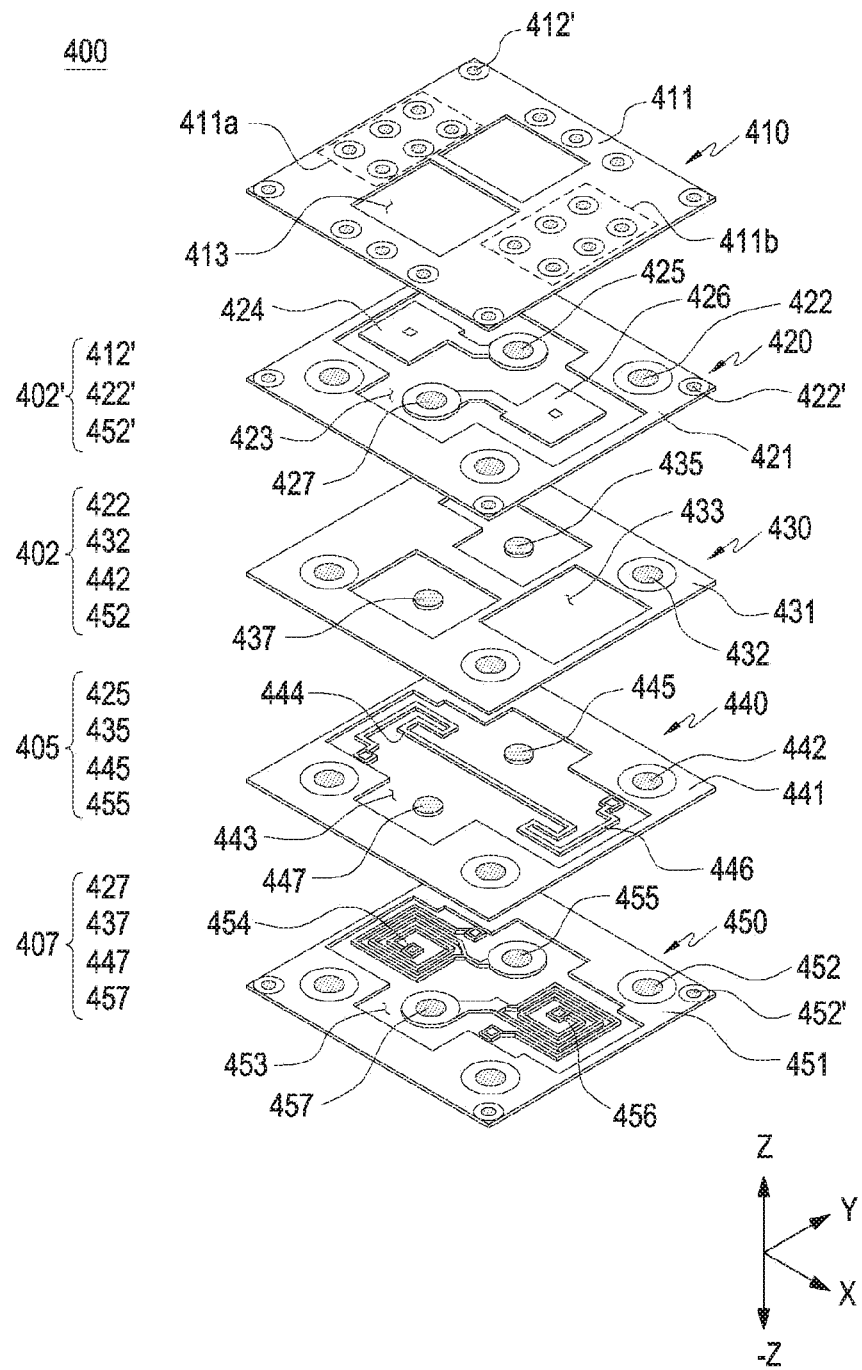
FIG. 5 is an exploded perspective view of the structures of the layers of the directional coupler embedded in the multilayer board, according to an embodiment.
Figure 6:
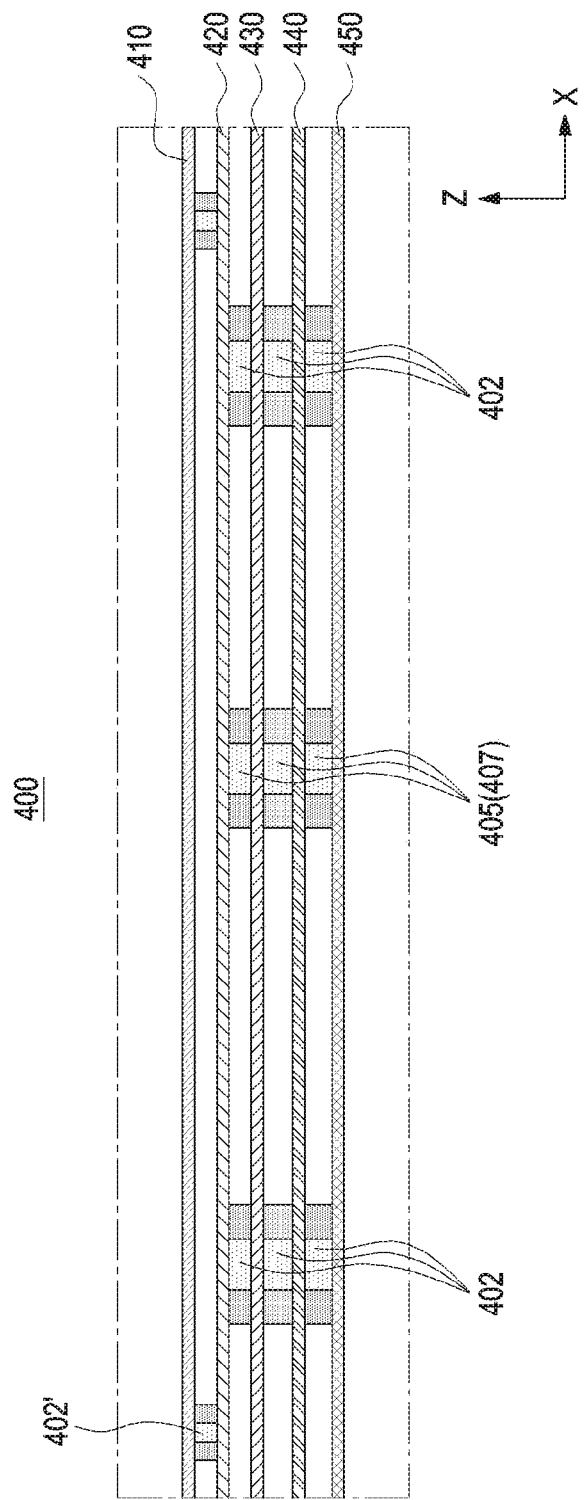
FIG. 6 is a sectional view diagram of the structures of the layers of the directional coupler embedded in the multilayer board, according to an embodiment.

FIG. 4 is a top view of structures of layers of a directional coupler embedded in a multilayer board, according to an embodiment. FIG. 5 is an exploded perspective view of the structures of the layers of the directional coupler embedded in the multilayer board, according to an embodiment. FIG. 6 is a sectional view of the structures of the layers of the directional coupler embedded in the multilayer board, according to an embodiment.

Referring to FIGS. 4 to 6, the directional coupler 400 may have a form in which it is embedded in a multilayer board. Embedding the directional coupler 400 in the multilayer board may include another example in which the elements included in the directional coupler 400 form at least a part of a printed circuit board (PCB). Embedding the directional coupler 400 in the multilayer board may include another example in which the PCB has a function of the directional coupler 400.

Referring to FIG. 4, the board in which the directional coupler 400 is embedded may be a multilayer board, for instance, a board that includes a first layer 410, a second layer 420, a third layer 440, and a fourth layer 450.

The first layer 410 may include at least one conductive portion. The second layer 420 may be disposed adjacent to the first layer 410 in a first direction (e.g., a direction parallel to a −Z axis of FIG. 5), and include at least one of conductive plate 424 and/or 426 corresponding to the conductive portions of the first layer 410. The third layer 440 may be disposed adjacent to the second layer 420 in the first direction, and include at least one of RF signal transmission lines 444 and/or 446. The fourth layer 450 may be disposed adjacent to the third layer 440 in the first direction, and include conductive lines, each of which is wound with at least one turn.

The first layer 410 may include, for instance, a first board part 411 formed of a conductor. The first layer 410 may include at least one of conductive portions (e.g., a first conductive portion 411a and/or a second conductive portion 411b). The conductive portion may correspond to a part of a region included in the first board part 411. As illustrated in FIG. 4, when viewed in the first direction, the first conductive portion 411a and/or the second conductive portion 411b may correspond to specified partial regions of the first board part 411 which overlap the conductive plates 424 and 426 of the second layer 420. The first conductive portion 411a and/or the second conductive portion 411b may correspond to the first conductive plate 424 and/or the second conductive plate 426 of the second layer 420 to be described below, and be operated as a capacitor.

At least one of conductive vias 412' for electrical connection with the neighboring other layer (e.g., the second layer 420) may be formed in the first board part 411. At least one opening 413 (or a fill-cut section) may be provided in the first layer 410. The at least one opening 413 may be filled with an insulator.

The second layer 420 may include, for instance, a second board part 421 formed of a conductor, and at least one of conductive vias 422 and 422' for electrical connection with the neighboring other layers (e.g., the first layer 410 and/or the third layer 440) may be formed in the second board part 421.

An opening 423 may be formed in the second layer 420. The second board part 421 may be formed around the opening 423 to at least partly surround the opening 423, and the opening 423 is provided, and thereby the conductive plates 424 and 426 may be electrically disconnected from the second board part 421. The opening 423 may be divided into a first opening region 423a in which the conductive vias 425 and 427 are located, and a second opening region 423b in which the conductive plates 424 and 426 are located.

The conductive plates 424 and 426 included in the second layer 420 may refer to conductor plates included in a capacitor. The conductive plates 424 and 426 included in the second layer 420 may include one metal plate, and be disposed in the first direction (e.g., the direction parallel to the −Z axis of FIG. 5). The conductive plates 424 and 426 included in the second layer 420 may have a specified area to realize a capacitor.

When the first layer 410 and the second layer 420 overlap each other, the first and second conductive portions 411a and 411b of the first layer 410 may be formed to be apart from the conductive plates 424 and 426 provided on the second layer 420 by a prescribed distance.

When the directional coupler 400 illustrated in FIG. 4 is a bi-directional coupler, the second layer 420 may include the first conductive plate 424 and the second conductive plate 426. The first conductive plate 424 may include a first conductive plate part 424a, a first capacitor terminal part 424b, and/or a first elongated part 424c that extends to one side of the first conductive plate part 424a. The second conductive plate 426 may include a second conductive plate part 426a, a second capacitor terminal part 426b, and/or a second elongated part 426c that extends to one side of the second conductive plate part 426a. The first and second capacitor terminal parts 424b and 426b may be portions that form terminals corresponding to the ports P2 and P5 aforementioned in FIG. 3. The first and second elongated parts 424c and 426c may be connected to the conductive vias 425 and 427 provided such that the first and second conductive plates 424 and 426 can be electrically connected to the conductive lines of the fourth layer 450 (to be described below), each of which is wound with at least one turn.

Referring to FIG. 4, in the second layer 420, the first and second conductive plates 424 and 426, and/or the conductive vias 425 and 427 may be spaced apart from the second board part 421, and be formed like an island structure. The first elongated part 424c of the first conductive plate 424 included in the second layer 420 is connected to the conductive via 425, and the second elongated part 426c of the second conductive plate 426 is connected to the conductive via 427. These components may be disposed in a state in which they are spaced apart from the second board part 421.

The opening 423 may be filled with an insulator to at least partly surround the first and second conductive plates 424 and 426 and/or the conductive vias 425 and 427. The insulator may support the first and second conductive plates 424 and 426 and/or the conductive vias 425 and 427. An isolation of the directional coupler 400 can be secured by forming a structure in which the first conductive plate 424 and the second conductive plate 426 can be electrically disconnected from the second board part 421 using the insulator.

An insulator may be disposed between the first layer 410 and the second layer 420. The directional coupler 400 may have a high-k film provided adjacent to the first conductive plate 424 and the second conductive plate 426. The high-k film is additionally or alternatively provided on the first conductive plate part 424a and/or the second conductive plate part 426a, and thereby specified capacitance can be readily secured.

When a capacitor is realized along with the first layer 410 and the second layer 420, the opening 413 formed in the first layer 410 may be provided for changing an isolation characteristic. Providing the opening 413 in the first layer 410 may be advantageous to isolation regulation compared to an embodiment that does not provide the opening 413.

The third layer 440 may include, for instance, a third board part 441 formed of a conductor, and at least one of conductive vias 442 for electrical connection with neighboring other layers (e.g., the second layer 420 and/or the fourth layer 450) may be formed in the third board part 441.

An opening 443 (or a fill-cut section) may be formed in the third layer 440. The third board part 441 may be formed around the opening 443 to at least partly surround the opening 443. The opening 443 may be divided into a third opening region 443a in which conductive vias 445 and 447 of the third layer 440 are located, and a fourth opening region 443b in which RF signal transmission lines 444 and 446 are disposed.

The RF signal transmission lines 444 and 446 included in the third layer 440 may be portions corresponding to the RF in/out line 310 of FIG. 3. Referring to FIG. 4, the RF signal transmission lines 444 and 446 included in the third layer 440 are given two reference signs for convenience of description, but may be substantially one signal transmission line.

As illustrated in FIG. 4, the RF signal transmission lines 444 and 446 included in the third layer 440 may include bent parts 444a and 446a, and terminal parts 444b and 446b. The bent parts 444a and 446a may be formed in the opening 443 (e.g., the fourth opening region 443b) at positions that correspond to the conductive plates (e.g., the first conductive plate 424 and/or the second conductive plate 426) provided on the second layer 420.

Parts of the RF signal transmission lines 444 and 446 may overlap at least parts of the conductive plates 424 and 426 of the second layer 420. When viewed in the first direction, parts of the RF signal transmission lines 444 and 446 (e.g., at least parts of the bent parts 444a and 446a) may be formed to overlap the conductive plates (e.g., the first conductive plate 424 and/or the second conductive plate 426) provided on the second layer 420. The terminal parts 444b and 446b are portions corresponding to the ports P1 and P4 aforementioned in FIG. 3, and may be a portion that receives an RF input signal and a portion that transmits an RF output signal. The RF signal transmission lines 444 and 446 are located apart from conductive vias 445 and 447 within the third layer 440. When the bi-directional coupler 400 is applied, the RF signal transmission lines 444 and 446 may have a form in which they extend to pass through a space between the two conductive vias 445 and 447.

The conductive vias 445 and 447 formed in the third layer 440 may be portions at which the conductive vias 425 and 427 of the second layer 420 extend.

The conductive vias 445 and 447 formed in the third layer 440 are formed to be apart from the RF signal transmission lines 444 and 446 by a prescribed distance, and thereby an isolation can be raised.

The RF signal transmission lines 444 and 446 are formed within the third layer 440 to have minimum lengths for the coupling of the directional coupler 400, attenuation of the RF signal can be minimized. Forming the RF signal transmission lines 444 and 446 to have the minimum lengths for the coupling of the directional coupler 400 may mean that the RF signal transmission lines 444 and 446 are formed within the third layer 440 as short as possible. Forming the RF signal transmission lines 444 and 446 to have the minimum lengths for the coupling of the directional coupler 400 may mean that, as illustrated in FIG. 4, the RF signal transmission lines 444 and 446 linearly extend in the space between the two conductive vias 445 and 447. The fourth layer 450 may include a fourth board part 451 formed of a conductor, and at least one of conductive vias 452 and 452' for electrical connection with the neighboring other layer (e.g., the third layer 440) may be formed in the fourth board part 451.

An opening 453 (or a fill-cut section) may be formed in the fourth layer 450. The fourth board part 451 may be formed around the opening 453 to at least partly surround the opening 453, and the opening 453 is provided, and thereby conductive lines and the fifth board part 451 provided on the fourth layer 450 may be electrically disconnected from each other. The opening 453 may be divided into a fifth opening region 453a in which the conductive vias 455 and 457 are located, and a sixth opening region 453b in which the conductive lines are located.

The at least one conductive line included in the fourth layer 450 may be intended to realize an inductor. The conductive line may be wound with at least one turn (or specified turns) in order to realize the inductors, and form a coil.

When the directional coupler 400 illustrated in FIG. 4 is a bi-directional coupler, the fourth layer 450 may form two inductors (e.g., a first inductor part 454 and a second inductor part 456) using the conductive lines. The first inductor part 454 may include a first coiled part 454a that is wound with at least one turn, a first inductor terminal part 454b, a second inductor terminal part 454c, and/or a third elongated part 454d that extends to one side of the first coiled part 454a. The second inductor part 456 may include a second coiled part 456a that is wound with at least one turn, a first inductor terminal part 456b, a second inductor terminal part 456c, and/or a fourth elongated part 456d that extends to one side of the second coiled part 456a.

When viewed in the first direction, at least parts of the first inductor part 454 and/or the second inductor part 456 may be formed to overlap the first conductive plate 424 and/or the second conductive plate 426 of the second layer 420.

The first inductor terminal part 454b or the second inductor terminal part 456b may be a portion corresponding to the port P2 or the port P5 aforementioned in FIG. 3. The first inductor terminal part 454c or the second inductor terminal part 456c may be a portion corresponding to the port P3 or the port P6 aforementioned in FIG. 3. The first inductor terminal part 454b or the first inductor terminal part 456b may be a portion corresponding to the port P3 or the port P6 aforementioned in FIG. 3, and the second inductor terminal part 454c or the second inductor terminal part 456c may be a portion corresponding to the port P2 or the port P5 aforementioned in FIG. 3.

The third elongated part 454c and the fourth elongated part 456c may be connected to the conductive vias 455 and 457 provided such that the first inductor part 454 and the second inductor part 456 can be electrically connected to the first conductive plate 424 and the second conductive plate 426 of the aforementioned second layer 420, respectively.

Referring to FIG. 4, in the fourth layer 450, the first and second inductor parts 454 and 456 or the conductive vias 455 and 457 may be spaced apart from the fourth board part 451, and be formed like an island structure. The third elongated part 454d of the first inductor part 454 of the fourth layer 450 may be connected to the conductive via 455, and the fourth elongated part 456d of the second inductor part 456 may be connected to the conductive via 457. An isolation of the directional coupler 400 can be secured by forming a structure in which the first inductor part 454 and the second inductor part 456 can be electrically disconnected from the fourth board part 451.

The layers that form the capacitor and the layer that forms the inductor may be formed nearby, and the layer on which the RF signal transmission lines are formed may be disposed outside these layers. The layer that forms the inductor may be disposed between the layers that form the capacitor and the RF signal transmission lines. In this case, as the inductor is located between the RF signal transmission lines and the capacitor, specified coupling efficiency cannot be readily secured.

The directional coupler 400 may include the first and second layers 410 and 420 that form the capacitor and the fourth layer 450 that forms the inductor, and the third layer 440 having the RF signal transmission lines may be provided between the layers that form the capacitor and the fourth layer 450. If the layer (e.g., the third layer 440) on which the RF signal transmission lines are formed is disposed between the layers (e.g., the first and second layers 410 and 420) that form the capacitor and the layer (e.g., the fourth layer 450) that forms the inductor, the capacitor and the inductor are disposed on both sides based on the RF signal transmission lines, and thus the directional coupler 400 capable of securing better coupling efficiency can be provided.

A spacer layer 430 having at least one opening 433 may be further provided between the second layer 420 and the third layer 440.

The spacer layer 430 may include a spacer board part 431 formed of a conductor, and at least one of conductive vias 432 for electrical connection with the neighboring other layers (e.g., the second layer 420 and/or the third layer 440) may be formed in the spacer board part 431.

An opening 433 (or a fill-cut section) may be formed in the spacer layer 430. The spacer board part 431 may be formed around the opening 433 to at least partly surround the opening 433. The spacer layer 430 may act as a component disposed between the second layer 420 and the third layer 440, and may be a component for securing an isolation of the directional coupler 400. The opening 433 formed in the spacer layer 430 may be divided into seventh opening regions 433a in which conductive vias 435 and 437 are located, and an eighth opening region 433b that is located at the portions corresponding to the conductive plates 424 and 426 of the second layer 420 (or the portions corresponding to the RF signal transmission lines of the fourth layer 440).

The eighth opening region 433b of the spacer layer 430 may be formed at a position that corresponds to at least one of the conductive plates 424 and 426 of the second layer 420. As illustrated in FIG. 4, the eighth opening region 433b is formed only at a position corresponding to the second conductive plate 426. This is merely based on a design for giving priority to the coupling signal (e.g., the forward coupling signal T1 or the reverse coupling signal T2) of one direction in the bi-directional coupler 400, and does not particularly limit the claims of various embodiments of the disclosure.

The conductive vias 435 and 437 may be disposed in the seventh opening regions 433a of the spacer layer 430. The conductive vias 435 and 437 disposed in the seventh opening regions 433a may be portions that are formed to extend from (or integrally with) the conductive vias 425 and 427 of the second layer 420. A separation distance between the conductive vias 435 and 437 and the spacer board part 431 and/or a size of the seventh opening regions 433a are properly adjusted, and thereby isolation which a user wants can be secured.

It is illustrated in FIG. 4 that the seventh opening regions 433a are provided on the spacer board part 431 in two places, and the eighth opening region 433b is provided on the spacer board part 431 in one place, but the disclosure is not necessarily limited thereto. The number of seventh and eighth opening regions 433a and 433b, sizes thereof, and/or positions thereof may be variously configured according to the specification of the directional coupler 400.

When RF signals are applied to the RF signal transmission lines 444 and 446, coupling based on electromagnetic induction or resonance is generated at the capacitor and/or the inductor, whereas the RF signal transmission lines can be attenuated by a capacitance component of the neighboring capacitor and/or an inductance component of the neighboring inductor. A capacitance component related to a variation of a voltage over time can produce a greater influence on the attenuation of the RF signal transmission lines than an inductance component related to a variation of a current over time. Therefore, the spacer layer 430 is provided between one (the second layer 420) of the layers realizing the capacitor and the third layer 440, and thereby the attenuation of RF signals can be effectively prevented.

Referring to FIGS. 5 and 6 together, it is illustrated that the first layer 410, the second layer 420, the spacer layer 430, the third layer 440, and/or the fourth layer 450 are disposed side by side in the first direction (e.g., the direction parallel to the −Z axis). When actually embedded in a PCB, the first layer 410, the second layer 420, the spacer layer 430, the third layer 440, and/or the fourth layer 450 may be formed as a part (e.g., a sub-board) of the multilayer board included in the PCB.

The second layer 420, the spacer layer 430, the third layer 440, and/or the fourth layer 450 include conductive vias 402 that connect the second board part 421, the spacer board part 431, the third board part 441, and/or the fourth board part 451, and may further include conductive vias 405 and 407 separately from the conductive vias 402. The conductive plates 424 and 426 and the inductor part 454 and 456 that are disposed within the layers different from each other may be electrically connected through the conductive vias 405 and 407.

Referring to FIG. 6, it is illustrated that the first layer 410, the second layer 420, the spacer layer 430, the third layer 440, and/or the fourth layer 450 are layered nearby. The directional coupler 400 may include the variously exemplified vias that are illustrated in FIG. 4 and act as members connecting the plurality of layers, and may further include, additionally or alternatively thereto, another connecting member or an interlayer member (e.g., an insulator) that is not illustrated in the drawings.

Referring to FIGS. 4 to 6 together, when the directional coupler 400 is formed as a bi-directional coupler, it can be ascertained that the components included in the bi-directional coupler 400 are formed inside the multilayer board in a mirror type. The components included in the directional coupler 400 (e.g., the conductive plates 424 and 426, the RF signal transmission lines 444 and 446, and/or the inductor parts 454 and 456) may be formed symmetrically with respect to a virtual line drawn on some of the layers inside the board (or the PCB) in one direction. The first and second conductive plates 424 and 426 included in the second layer 420 of the directional coupler 400 may have a shape that is symmetric with respect to a virtual line drawn on the second layer 420 in one direction (e.g., a virtual line connecting the conductive via 425 and the conductive via 427) on both sides (e.g., left and right sides).

The passive element such as a capacitor or an inductor is embedded in the board, and thereby space efficiency can be increased. Further, a directional coupler having a good isolation characteristic even in the state embedded in the board can be provided.

Figure 7:
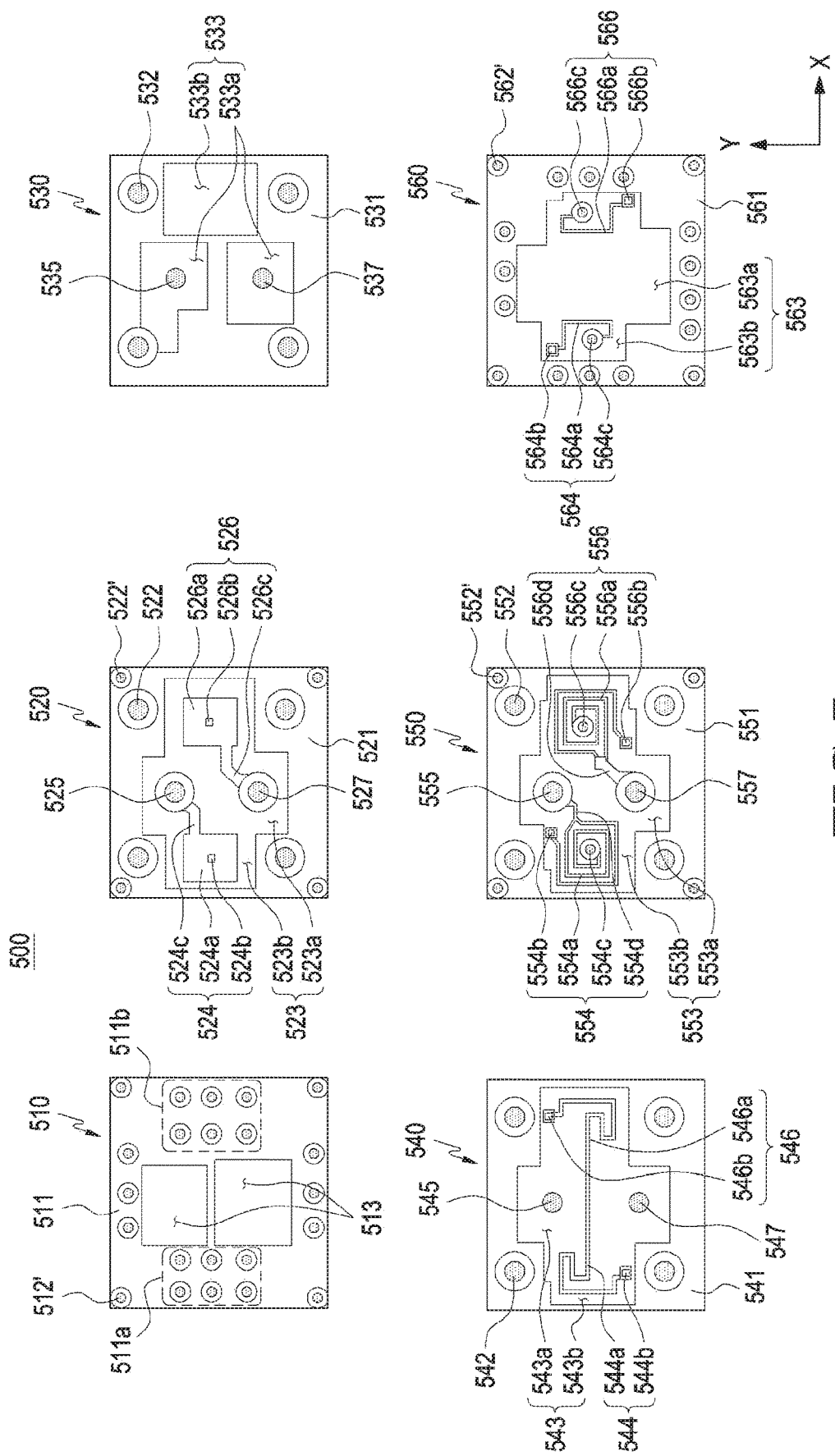
FIG. 7 is a top view diagram of structures of layers of a directional coupler embedded in a multilayer board, according to an embodiment.
Figure 8:
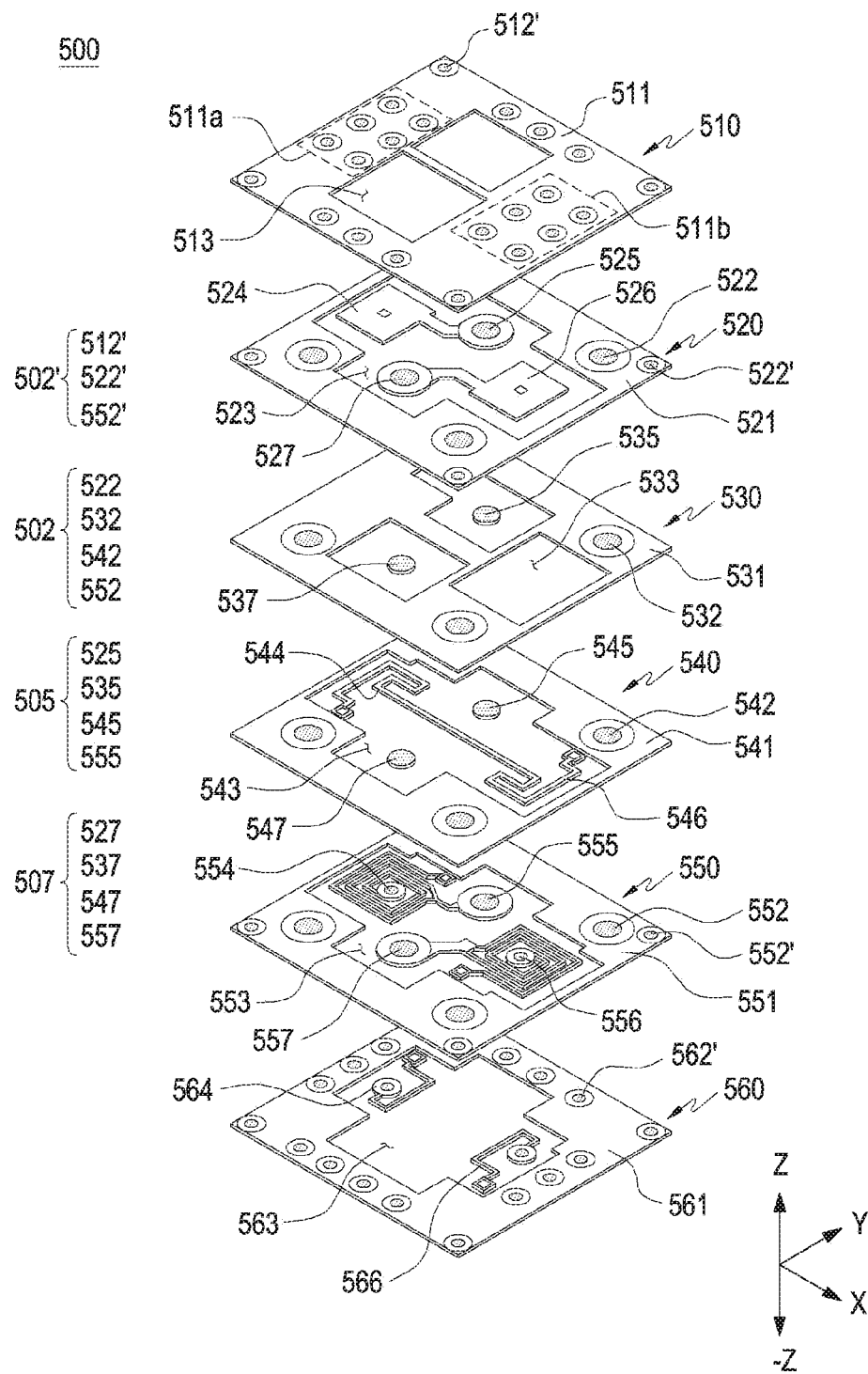
FIG. 8 is an exploded perspective view of the structures of the layers of the directional coupler embedded in the multilayer board, according to an embodiment.
Figure 9:
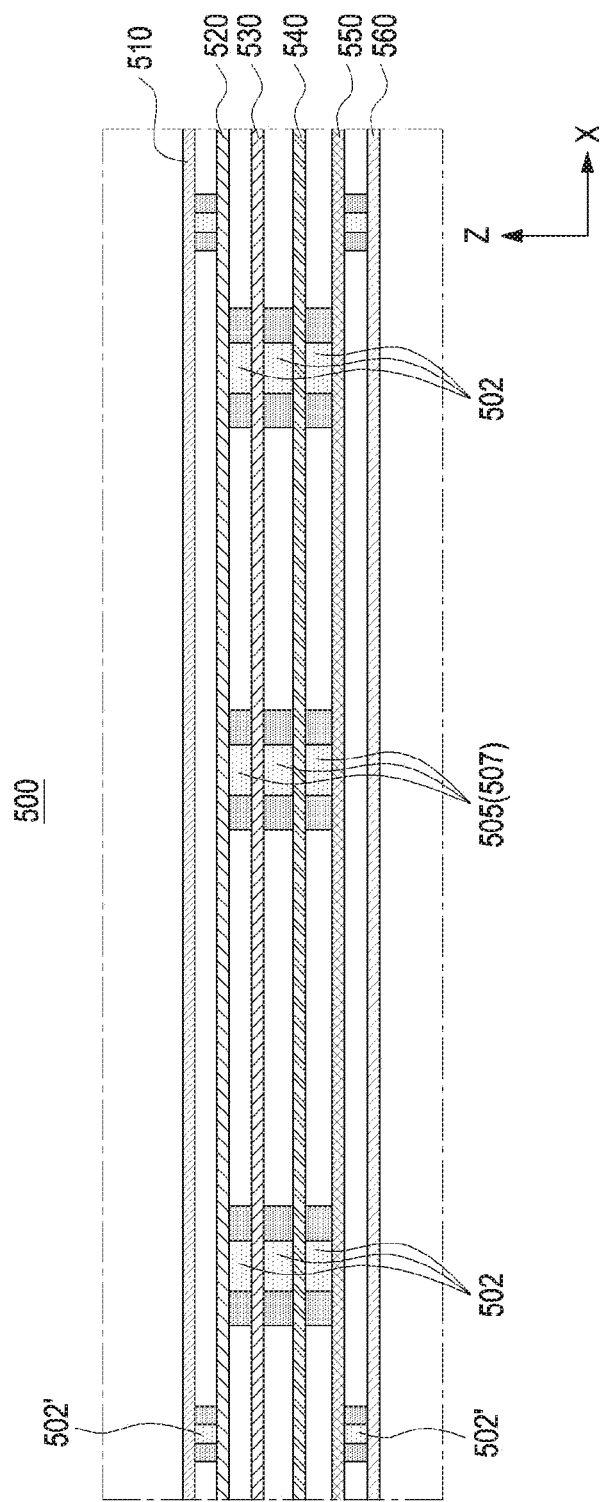
FIG. 9 is a sectional view diagram of the structures of the layers of the directional coupler embedded in the multilayer board, according to an embodiment.

FIG. 7 is a top view of structures of layers of a directional coupler embedded in a multilayer board, according to an embodiment. FIG. 8 is an exploded perspective view of the structures of the layers of the directional coupler embedded in the multilayer board, according to an embodiment. FIG. 9 is a sectional view of the structures of the layers of the directional coupler embedded in the multilayer board, according to an embodiment.

The directional coupler 500 according to a different embodiment from those illustrated in FIGS. 4 to 6 is disclosed. Here, a board in which the directional coupler 500 is embedded may be a multilayer board, and may be, for instance, a board that includes a first layer 510, a second layer 520, a third layer 540, and a fourth layer 550, and further includes at least another layer (e.g., a fifth layer 560) in addition to them.

The first layer 510 (e.g., the first layer 410 of FIG. 4) may include at least one conductive portion. The second layer 520 (e.g., the second layer 420 of FIG. 4) may be disposed adjacent to the first layer 510 in the first direction (e.g., the direction parallel to the −Z axis of FIG. 8), and may include at least one of conductive plates 524 and 526 (e.g., the conductive plates 424 and 426 of FIG. 4) that at least partly overlap the conductive portions of the first layer 510 when viewed in the first direction. The spacer layer 530 (e.g., the spacer layer 430 of FIG. 4) may be disposed adjacent to the second layer 520 in the first direction, and may include at least one opening 533 (e.g., the opening 433 of FIG. 4). The third layer 540 (e.g., the third layer 440 of FIG. 4) may be disposed adjacent to the spacer layer 530 in the first direction, and may include at least one of RF signal transmission lines 544 and 546 (e.g., the RF signal transmission lines 444 and 446 of FIG. 4). The fourth layer 550 (e.g., the fourth layer 450 of FIG. 4) may be disposed adjacent to the third layer 540 in the first direction, and may include conductive lines (e.g., the conductive lines of FIG. 4), each of which is wound with at least one turn. Hereinafter, description repeated with those of the embodiments of FIGS. 4 to 6 will be omitted.

The directional coupler 500 may further include the fifth layer 560 that is disposed adjacent to the fourth layer 550 and has conductive lines that are electrically connected to the conductive lines that are included in the fourth layer 550 and are each wound with at least one turn.

The fifth layer 560 may include, for instance, a sixth board part 561 formed of a conductor. According to one embodiment, at least one of conductive vias 562' for electrical connection with the neighboring other layer (e.g., the fourth layer 550) may be formed in the sixth board part 561.

An opening 563 (or a fill-cut section) may be formed in the fifth layer 560. Inductor parts 564 and 566 formed of conductive lines may be disposed in the opening 563. The sixth board part 561 may be formed around the opening 563 to at least partly surround the opening 563, and the opening 563 may be provided, and thereby the inductor parts 564 and 566 and the sixth board part 561 may be electrically disconnected from each other. The opening 563 may be divided into an opening region 563a formed to correspond to a region in which conductive vias 555 and 557 of the fourth layer 550 are located, and an opening region 563b in which the inductor parts 564 and 566 are located.

The opening 563 formed in the fifth layer 560 may be provided for changing an isolation characteristic of the directional coupler 500. In the fifth layer 560, providing the opening region 563b formed to correspond to the region in which the conductive vias of the fourth layer 550 are located may be advantageous to the isolation regulation compared to an embodiment that does not provide the opening region 563b.

When the directional coupler 500 illustrated in FIG. 7 is a bi-directional coupler, the fifth layer 560 may include the two inductor parts (e.g., the first elongated inductor part 564 and the second elongated inductor part 566) that are electrically connected to the two inductor parts 454 and 456 formed in the fourth layer 550.

The first elongated inductor part 564 may include a first elongated line 564a, a third inductor terminal part 564b, and a via 564c for electrical connection with the conductive line formed on the fourth layer 550. The first elongated line 564a may be wound with at least one turn.

The second elongated inductor part 566 may include a second elongated line 566a, a fourth inductor terminal part 566b, and a via 566c for electrical connection with the conductive line formed on the fourth layer 550. Although not illustrated in the drawings, the second elongated line 566a may be wound with at least one turn.

The directional coupler 500 may further include the fifth layer 560, and thereby an isolation of terminal ports (e.g., the first and second terminal ports P3 and P6) can be more minutely regulated.

Since the fifth layer 560 may be additionally provided, the fourth layer 550 may be different from the fourth layer 450 in the embodiments illustrated in FIGS. 4 to 6. In the embodiments illustrated in FIGS. 4 to 6, the first inductor part 454 of the fourth layer 450 may include the first coiled part 454a, the first inductor terminal part 454b, the second inductor terminal part 454c, and/or the elongated part 454d, and the second inductor part 456 may include the second coiled part 456a, the first inductor terminal part 456b, the second inductor terminal part 456c, and/or the elongated part 456d. Referring to the embodiments illustrated in FIGS. 4 to 6, in the fourth layer 450 of the directional coupler 400, the coupling ports and the terminal ports of the directional coupler 400 may be realized together.

In contrast, in the embodiments illustrated in FIGS. 7 to 9, the first inductor part 554 of the fourth layer 550 may include a first coiled part 554a, a first inductor terminal part 554b, a via 554c, and/or an elongated part 554d, and the second inductor part 556 may include a second coiled part 556a, a second inductor terminal part 556b, a via 556c, and/or an elongated part 556d.

The directional coupler 500 may further include the fifth layer 560. The first elongated inductor part 564 of the fifth layer 560 may include the third coiled part 564a, the third inductor terminal part 564b, and/or the via 564c, and the second elongated inductor part 566 may include the fourth coiled part 566a, the fourth inductor terminal part 566b, and/or the via 566c.

Referring to the embodiments illustrated in FIGS. 7 to 9, the directional coupler 500 can be realized by distinguishing between the coupling ports (or the terminal ports) formed in the fourth layer 550 and the terminal ports (or the coupling ports) formed in the fifth layer 560. When the directional coupler 500 includes the additional layer (e.g., the fifth layer 560) as in FIGS. 7 to 9, the conductive line acting as an inductor can be substantially elongated. Thus, the directional coupler 500 capable of raising a degree of freedom of design, providing excellent isolation, and supporting a wideband can be provided.

Figure 10:
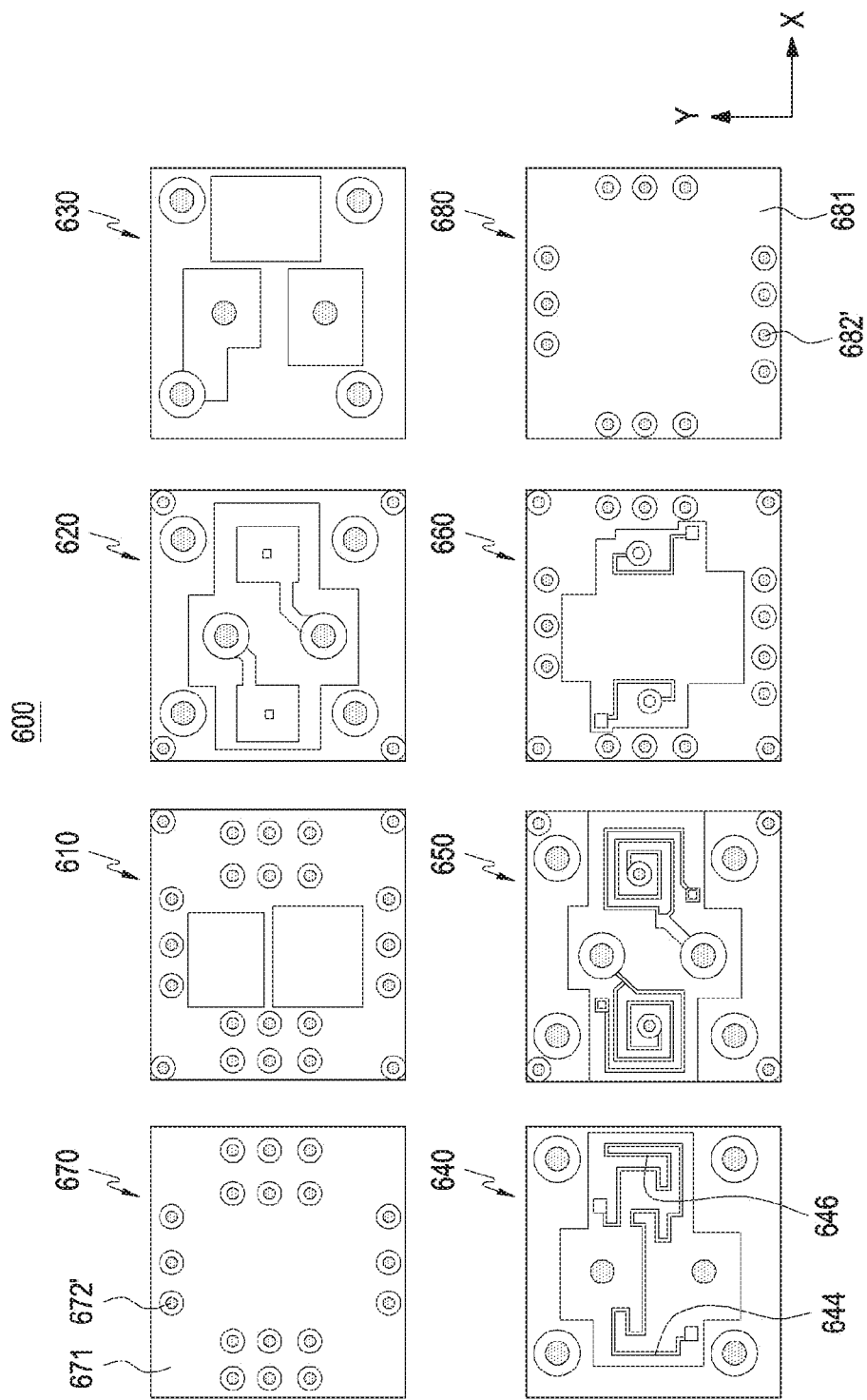
FIG. 10 is a top view diagram of structures of layers of a directional coupler embedded in a multilayer board, according to an embodiment.
Figure 11:
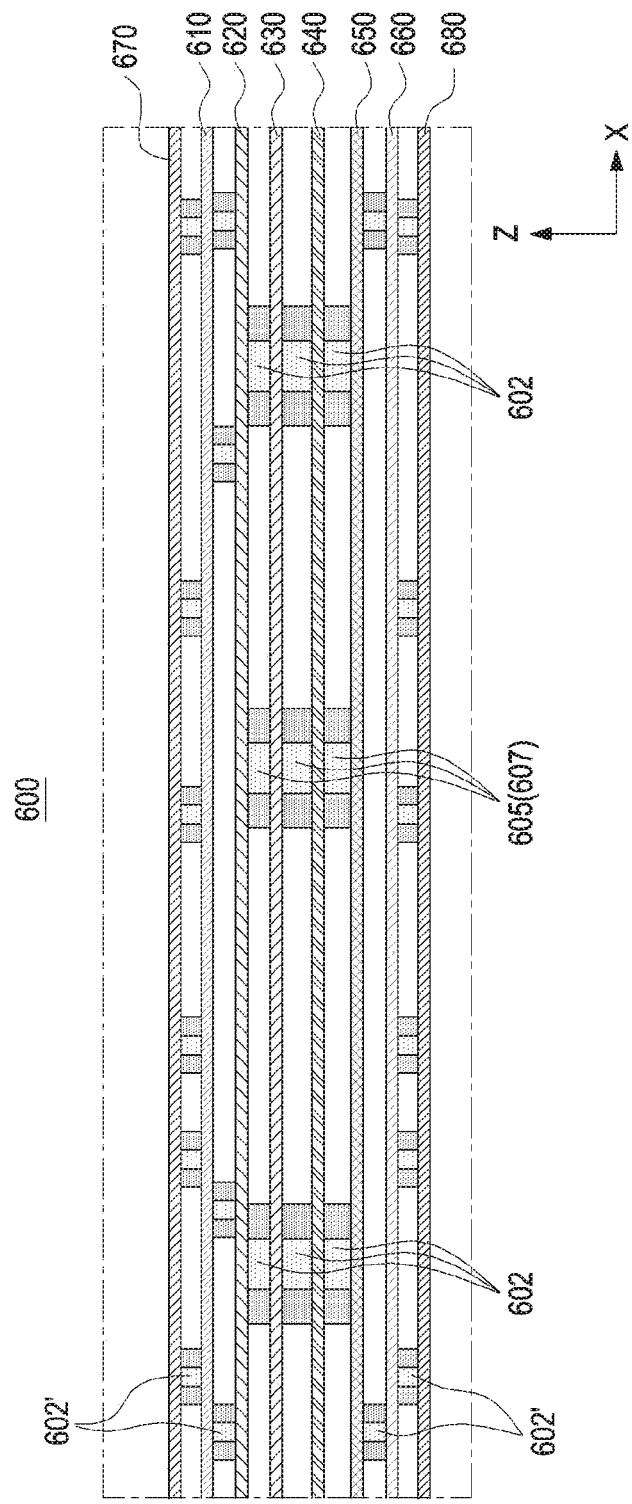
FIG. 11 is a sectional view diagram of the structures of the layers of the directional coupler embedded in the multilayer board, according to an embodiment.

FIG. 10 is a top view of structures of layers of a directional coupler embedded in a multilayer board, according to an embodiment. FIG. 11 is a sectional view of the structures of the layers of the directional coupler embedded in the multilayer board, according to an embodiment.

A board in which the directional coupler 600 is embedded may be a multilayer board, and may include, for instance, a first layer 610, a second layer 620, a spacer layer 630, a third layer 640, a fourth layer 650, or a fifth layer 660, and further includes at least one of other layers (e.g., a first ground layer 670 and/or a second ground layer 680) in addition to them. In FIGS. 10 to 11, the embodiment in which the first ground layer 670 and/or the second ground layer 680 are additionally included in the directional coupler 600 in which the first layer 610, the second layer 620, the spacer layer 630, the third layer 640, the fourth layer 650, and the fifth layer 660 are formed is illustrated as an example.

The first layer 610 (e.g., the first layer 410 of FIG. 4) may include at least one conductive portion. The second layer 620 (e.g., the second layer 420 of FIG. 4) may be disposed adjacent to the first layer 610 in the first direction (the direction parallel to the −Z axis), and may include at least one of conductive plates 424 and 426 that at least partly overlap the conductive portions of the first layer 610 when viewed in the first direction. The spacer layer 630 (e.g., the spacer layer 430 of FIG. 4) may be disposed adjacent to the second layer 620 in the first direction, and may include at least one opening 633 (e.g., the opening 433 of FIG. 4). Further, the third layer 640 (e.g., the third layer 440 of FIG. 4) may be disposed adjacent to the spacer layer 630 in the first direction, and may include at least one of RF signal transmission lines 644 and 646 (e.g., the RF signal transmission lines 444 and 446 of FIG. 4). The fourth layer 650 (e.g., the fourth layer 450 of FIG. 4) may be disposed adjacent to the third layer 640 in the first direction, and may include conductive lines, each of which is wound with at least one turn.

The directional coupler 600 may further include the fifth layer 660 that is disposed adjacent to the fourth layer 650 and has conductive lines that are electrically connected to the conductive lines that are included in the fourth layer 650 and are each wound with at least one turn.

Hereinafter, description repeated with those of the embodiments of FIGS. 4 to 9 will be omitted.

The directional coupler 600 may further include the first ground layer 670 that is disposed adjacent to the first layer 610 in a second direction (direction parallel to the Z axis) that is opposite to the first direction (the direction parallel to the −Z axis).

The first ground layer 670 may be included in a PCB. For example, the first ground layer 670 may include a seventh board part 671 formed of a conductor, and at least one of conductive vias 672' for electrical connection with the neighboring other layer (e.g., the first layer 610) may be formed in the seventh board part 671.

The directional coupler 600 may further include the second ground layer 680 that is disposed adjacent to the fifth layer 660 in the first direction (the direction parallel to the −Z axis).

The second ground layer 680 may be included in the PCB. The second ground layer 680 may include an eighth board part 681 formed of a conductor, and at least one of conductive vias 682' for electrical connection with the neighboring other layer (e.g., the fifth layer 660) may be formed in the eighth board part 681.

The directional coupler 600 further includes the first ground layer 670 and/or the second ground layer 680, and thereby can provide grounds on the RF signal transmission lines included in the third layer 640 and interrupt electromagnetic waves introduced from the outside.

The RF signal transmission lines 644 and 646 provided on the third layer 640 may have various forms according to the specification required of the directional coupler 600. As illustrated in FIG. 10, transmission lines in which one portion (e.g., 646) of the RF signal transmission lines has a longer length and more bent portions than the other portion (e.g., 644) may be formed.

Referring to FIG. 11, it is illustrated that the first ground layer 670, the first layer 610, the second layer 620, the spacer layer 630, the third layer 640, the fourth layer 650, the fifth layer 660, or the second ground layer 680 is layered. The directional coupler 600 may include the vias 605 (or 607), 602 and 602' that are illustrated in FIG. 11 and act as members connecting the plurality of layers, and may additionally or alternatively include another connecting member or an interlayer member (e.g., an insulator) that is not illustrated in the drawings in addition to the vias. The vias 605 or 607 acting as the variously exemplified vias may be vias that electrically connect components for realizing a capacitor and an inductor. The vias 602 and 602' may be vias for electrically connecting the conductive portions of the layers or adjusting a ground level. In FIG. 11, one example in which the various vias are disposed between the plurality of board structures is illustrated, but the disclosure is not necessarily limited thereto.

Figure 12:
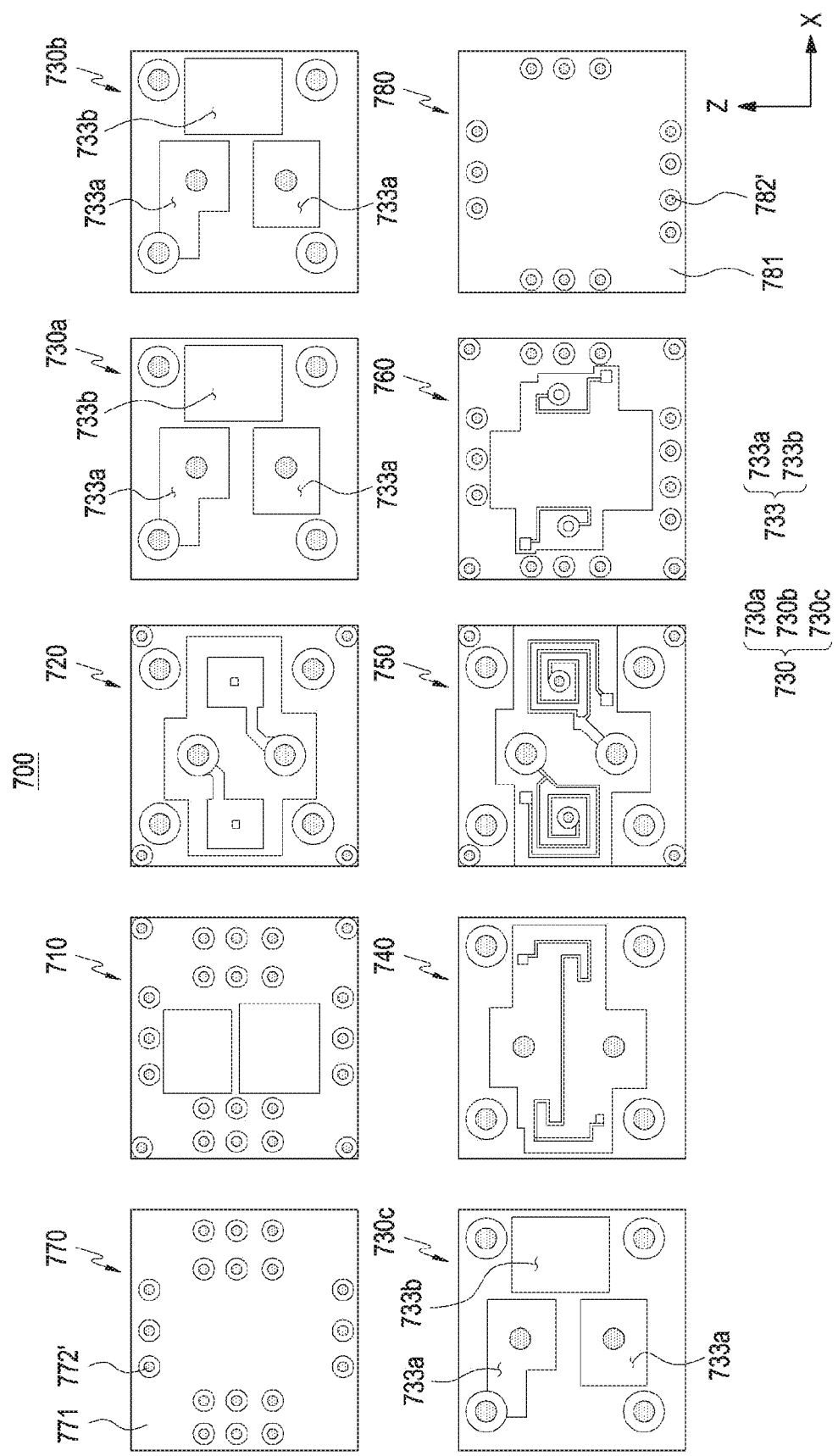
FIG. 12 is a top view diagram of structures of layers of a directional coupler embedded in a multilayer board, according to an embodiment.
Figure 13:
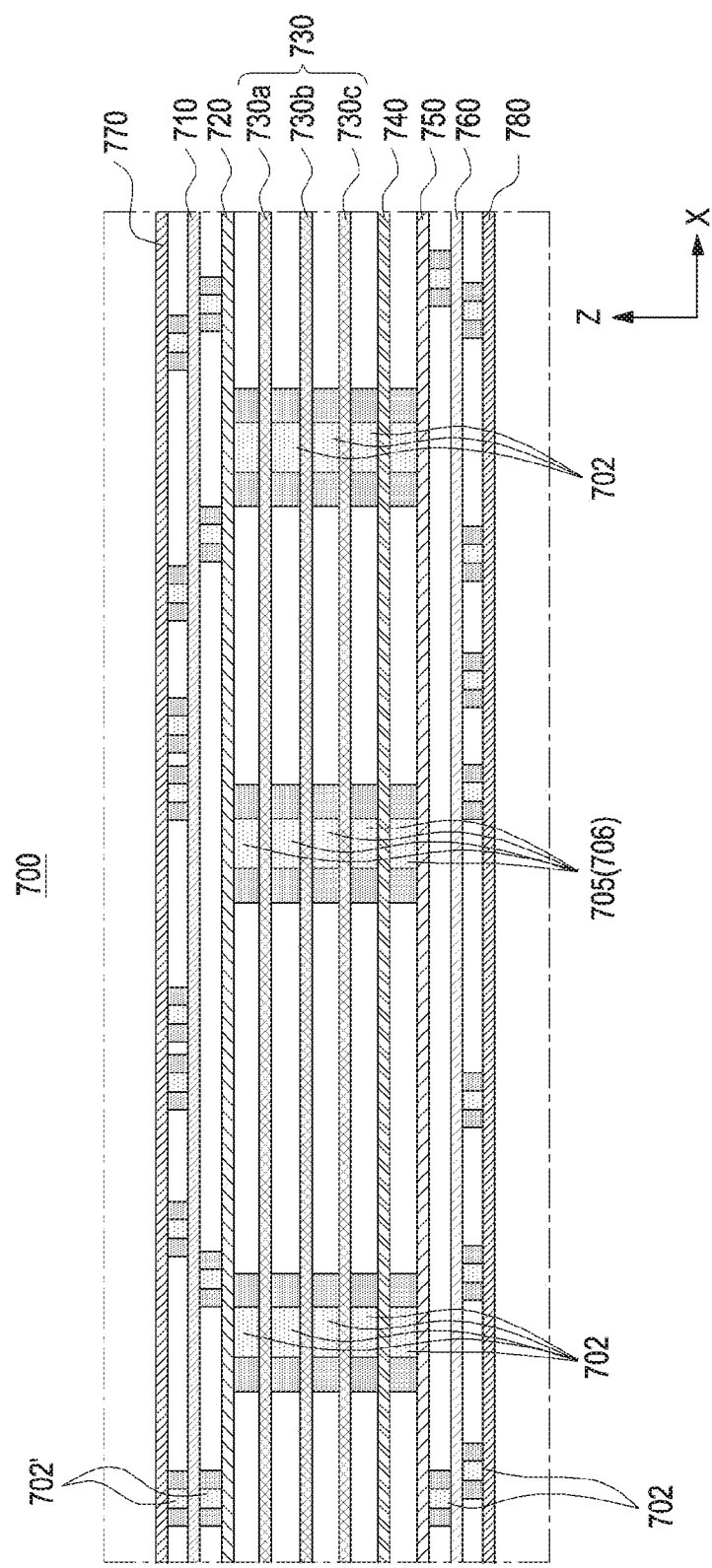
FIG. 13 is a sectional view diagram of the structures of the layers of the directional coupler embedded in the multilayer board, according to an embodiment.

FIG. 12 is a top view of structures of layers of a directional coupler embedded in a multilayer board, according to an embodiment. FIG. 13 is a sectional view of the structures of the layers of the directional coupler embedded in the multilayer board, according to an embodiment.

A board in which the directional coupler 700 is embedded may be a multilayer board, and may be a board that includes a first layer 710, a second layer 720, a spacer layer 730, a third layer 740, or a fourth layer 750 and further includes at least one of other layers in addition to them. In FIGS. 12 to 13, the second layer 720, the spacer layer 730, the third layer 740, and the fourth layer 750, and a fifth layer 760, a first ground layer 770, or a second ground layer 780 are formed, the spacer layer 730 is provided as a plurality of layers 730a, 730b and 730c is illustrated as an example.

The first layer 710 (e.g., the first layer 410 of FIG. 4) may include at least one conductive portion. The second layer 720 (e.g., the second layer 420 of FIG. 4) may be disposed adjacent to the first layer 710 in the first direction (the direction parallel to the −Z axis), and may include at least one of conductive plates (e.g., the conductive plates 424 and 426 of FIG. 4) that at least partly overlap the conductive portions of the first layer 710 when viewed in the first direction. The spacer layer 730 (e.g., the spacer layer 430 of FIG. 4) may be disposed adjacent to the second layer 720 in the first direction, and may include at least one opening (e.g., the opening 433 of FIG. 4). Further, the third layer 740 (e.g., the fourth layer 440 of FIG. 4) may be disposed adjacent to the spacer layer 730 in the first direction, and may include at least one of RF signal transmission lines 444 and 446. The fourth layer 750 (e.g., the fourth layer 450 of FIG. 4) may be disposed adjacent to the fourth layer 740 in the first direction, and may include conductive lines (e.g., the conductive lines of FIG. 4) that at least partly overlap the conductive plates 424 and 426 of the second layer 720 when viewed in the first direction and are each wound with at least one turn.

The directional coupler 700 may further include the fifth layer 760 that is disposed adjacent to the fourth layer 750 and has conductive lines electrically connected to the conductive lines that are included in the fourth layer 750 and are each wound with at least one turn.

The directional coupler 700 may further include the first ground layer 770 that is disposed adjacent to the first layer 710 in the second direction (the direction parallel to the Z axis) that is opposite to the first direction (the direction parallel to the −Z axis), and the second ground layer 780 is disposed adjacent to the sixth layer 760 in the first direction.

Hereinafter, description repeated with those of the embodiments of FIGS. 4 to 11 will be omitted.

Referring to FIGS. 12 and 13, the directional coupler 700 may include a plurality of spacer layers 730. A plurality of spacer layers 730a, 730b and 730c may be located between the second layer 720 in which the conductive plates 424 and 426 are formed and the third layer 740 in which the RF signal transmission lines 444 and 446 are formed, and may separate the second layer 720 and the third layer 740 by a specified distance. Thereby, capacitance of the directional coupler 700 can be changed. Insertion loss characteristics and/or an isolation characteristic may be changed in response to a specified design value by changing the capacitance. Attenuation of RF signals may incurred by the conductive plates of the second layer 720. To prevent this, the plurality of spacer layers 730a, 730b and 730c may be disposed between the second layer 720 and the RF signal transmission lines, and the insertion loss characteristics may be changed. The plurality of spacer layers 730a, 730b and 730c may be disposed between the second layer 720 and the RF signal transmission lines, and the isolation characteristic may be changed.

The number of the plurality of layers included in the spacer layer 730 is not limited to the number illustrated in the drawing. The spacer layers 730 that are less or more than the number illustrated in the drawing may be disposed.

The opening 733 formed in the spacer layer 730 may be divided into a seventh opening region 733*a* in which the conductive vias 435 and 437 are located, and an eighth opening region 733*b* that is located at a portion corresponding to at least a part of the conductive plates 424 and 426 of the second layer 720 or portions corresponding to the RF signal transmission lines of the third layer 740. Here, a size, position, shape, and number of the eighth opening region 733*b* may be variously set in consideration of various elements including coupling efficiency or permittivity of the directional coupler.

Referring to FIG. 13, it is illustrated that the first ground layer 770, the first layer 710, the second layer 720, the plurality of spacer layers 730, the third layer 740, the fourth layer 750, the fifth layer 760, or the second ground layer 780 are layered. The directional coupler 700 may include the variously exemplified vias 705 (or 706), 702 and 702' that are illustrated in FIG. 13 and act as members connecting the plurality of layers, and may additionally or alternatively include another connecting member or an interlayer member (e.g., an insulator) in addition to the vias. Hereinafter, description repeated with the embodiment of FIG. 11 will be omitted.

The directional coupler 230, 300, 400, 500, 600 or 700 may be embedded on (or in) the board. In this case, each layer included in the directional coupler 230, 300, 400, 500, 600 or 700 may form at least a part of the sub-board. As illustrated in FIGS. 3, 6, 9, 11 and 13, in the directional coupler 300, 400, 500, 600 or 700, the layers may be disposed adjacent to each other, be directly layered, and be separated therebetween by a prescribed distance, and various insulators (or dielectrics) may be disposed in a space between the layers.

In relation to the number of layers constituting the board, the directional couplers 230, 300, 400, 500, 600 and 700 of the disclosure is not limited to the embodiments illustrated in FIGS. 3 to 13, and may be specified to have various numbers in consideration of various specifications or permittivity of the PCB, and an effective space inside the electronic device. As in FIGS. 12 and 13, increasing the number of boards can be advantageous to raise performance of the directional coupler.

In consideration of an insertion loss even in the state embedded in the board, a directional coupler of a new structure having an excellent coupling (coupling efficiency), an isolation, and directivity may be provided. Further, a space occupied by a directional coupler according to the related art can be reduced in an electronic device, and thereby the elements (e.g., the conductive plates, the RF signal transmission lines, and the conductive lines) that are included in the board and replace the existing passive elements can be more freely designed. Thereby a directional coupler capable of covering a wideband can be provided.

Figure 14:
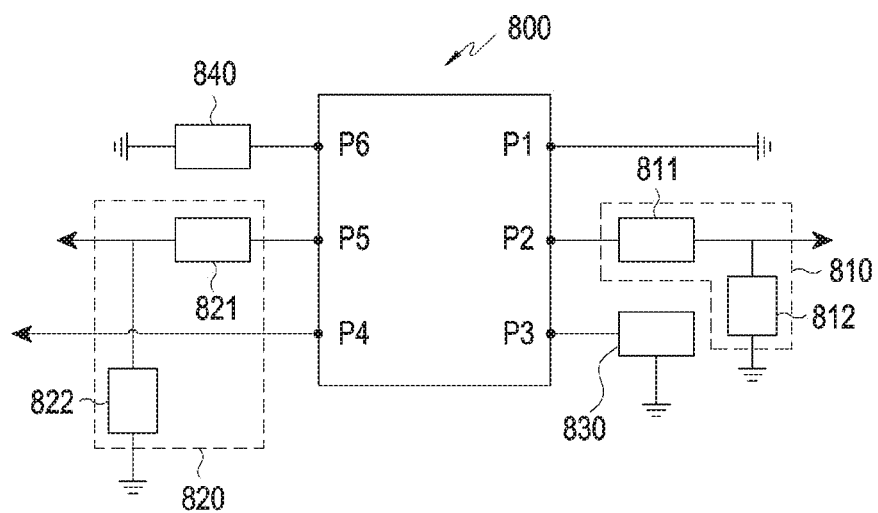
FIG. 14 is a diagram of a directional coupler to which an external matching element is additionally coupled, according to an embodiment.

FIG. 14 is a diagram of a directional coupler to which an external matching element is additionally coupled, according to an embodiment.

A directional coupler 800 may additionally include external matching elements in first and second coupler ports P2 and P5 and/or first and second terminal ports P3 and P6. The external matching elements may include passive elements such as a resistor, an inductor, or a capacitor.

Referring to FIG. 14, a first external matching element 810 including, for instance, a resistor as a 1-1st external matching element 811 and a capacitor as a 1-2nd external matching element 812 may be connected to the first coupler port P2 of the directional coupler 800. Further, a second external matching element 820 including a resistor as a first external matching element 821 and a capacitor as a first external matching element 822 may be connected to the second coupler port P5 of the directional coupler 800. Further, third and fourth external matching elements 830 and 840, in each of which a resistor is disposed, may be connected to the first and second terminal ports P3 and P6 of the directional coupler 800 according to one embodiment.

Figure 15:
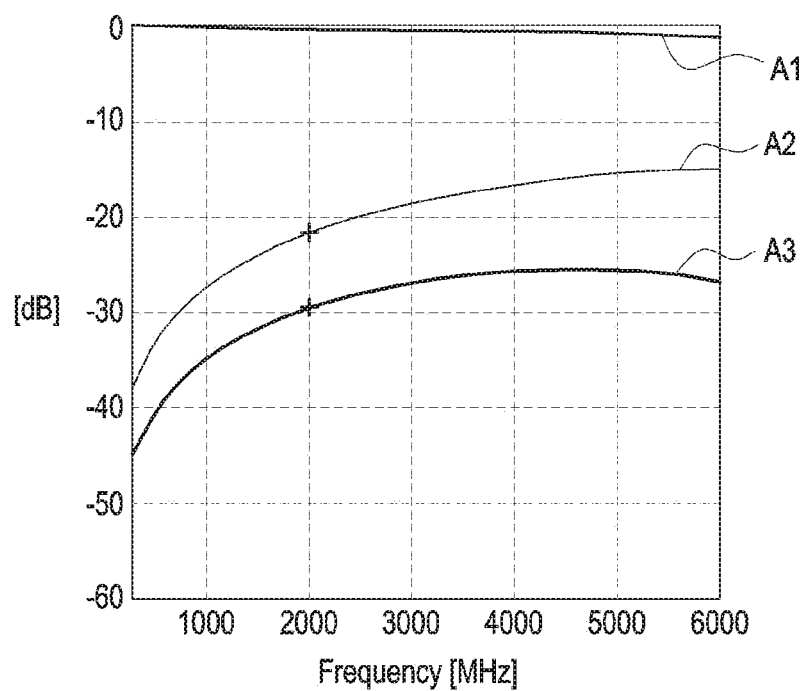
FIG. 15 is a graph illustrating isolation performance of the directional coupler before the external matching elements are added, according to an embodiment.

FIG. 15 is a graph of isolation performance of the directional coupler before the external matching elements are added, according to an embodiment.

As one method of measuring the performance of the directional coupler, the isolation of the directional coupler can be secured in a range of various frequencies (e.g., 0 to 6000 MHz) by sampling an RF signal.

Referring to FIG. 15, in a state in which the external matching elements (e.g., the external matching elements 810, 820, 830 and 840 of FIG. 14) are not connected to the directional coupler, an RF signal passing the RF input port (e.g., the RF input port P1 of FIG. 3) and the RF output port (e.g., the RF output port P4 of FIG. 3) in the range of various frequencies may be indicated by a graph A1. A coupling signal extracted between the RF input port (e.g., the RF input port P1 of FIG. 3) and the first coupling port (e.g., the first coupling port P2 of FIG. 3) in the range of various frequencies may be indicated by a graph A2. A coupling signal extracted between the RF input port (e.g., the RF input port P1 of FIG. 3) and the first terminal port (e.g., the first terminal port P3 of FIG. 3) in the range of various frequencies may be indicated by a graph A3.

Figure 16:
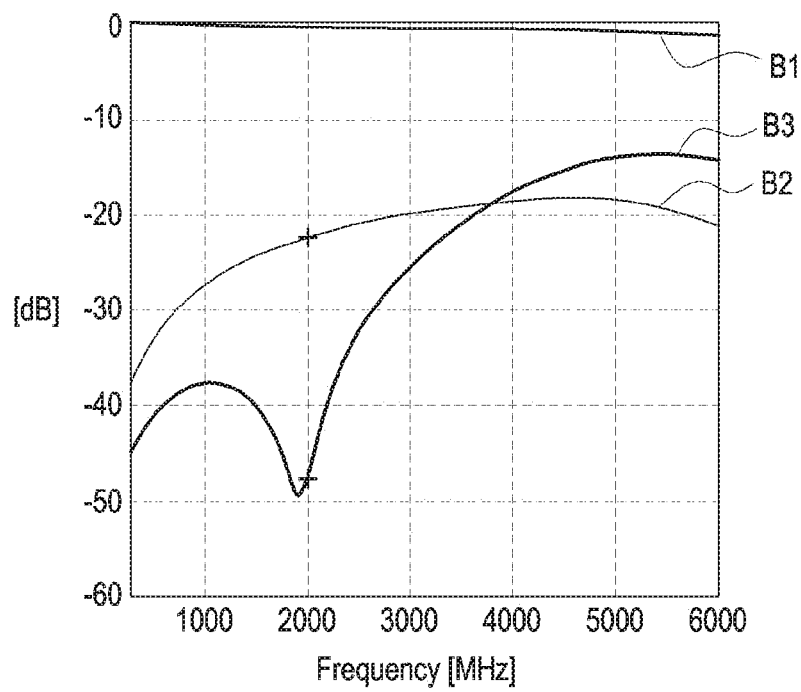
FIG. 16 is a graph illustrating an isolation characteristic of the directional coupler to which the external matching element is added according to an embodiment.

FIG. 16 is a graph illustrating an isolation characteristic of the directional coupler to which the external matching element is added according to various embodiment.

After the two passive elements (e.g., the first external matching element 811 and the second external matching element 812) constituting the external matching element 810 are connected to the first coupling port (e.g., the first coupling port P2 of FIG. 3) of the directional coupler (e.g., the directional coupler 800 of FIG. 14), the isolation characteristic can be ascertained.

Graphs in which, after a series 1.2 nH as the first external matching element 811 and a shunt 1.8 pF as the second external matching element 812 are connected to the first coupling port (e.g., the first coupling port P2 of FIG. 3) of the directional coupler (e.g., the directional coupler 800 of FIG. 14), the isolation performance that is exhibited may be illustrated in FIG. 16 by B1, B2, and B3. An RF signal passing the RF input port (e.g., the RF input port P1 of FIG. 3) and the RF output port (e.g., the RF output port P4 of FIG. 3) in the range of various frequencies may be indicated by the graph B1. A coupling signal extracted between the RF input port (e.g., the RF input port P1 of FIG. 3) and the first coupling port (e.g., the first coupling port P2 of FIG. 3) in the range of various frequencies may be indicated by the graph B2. A coupling signal extracted between the RF input port (e.g., the RF input port P1 of FIG. 3) and the first terminal port (e.g., the first terminal port P3 of FIG. 3) in the range of various frequencies may be indicated by the graph B3.

Referring to FIGS. 15 and 16, the embodiment (e.g., FIG. 16) in which the external matching element 810 is added to the first coupling port (e.g., the first coupling port P2 of FIG. 3) of the directional coupler (e.g., the directional coupler 800 of FIG. 14) may have an isolation having a lower value in a wider frequency range, compared to the embodiment (e.g., FIG. 15) in which the external matching element 810 is not added. It can be ascertained that the directional coupler as illustrated in FIG. 15 has only an isolation of about −45 dB in a frequency band around 0 MHz, and the directional coupler as illustrated in FIG. 16 can have isolation of about −45 dB in a frequency band around 0 MHz as well as additionally secure an isolation of about −50 dB in a frequency band around 2000 MHz.

Putting the above contents together, it can be ascertained that the external matching element 810 is additionally connected to the first coupling port (e.g., the first coupling port P2 of FIG. 3), and thereby the isolation is changed.

Figure 17:
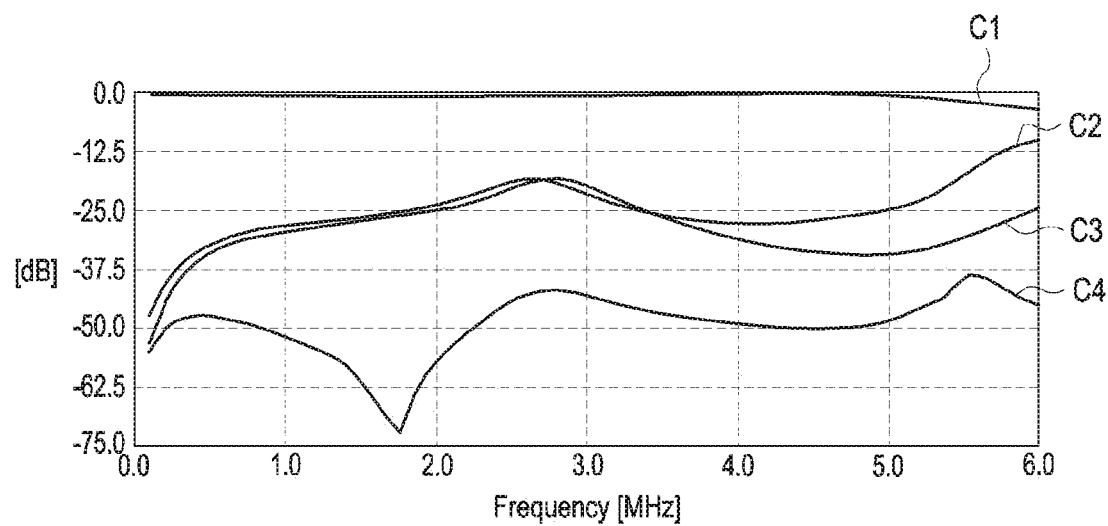
FIG. 17 is a graph illustrating an isolation characteristic of the directional coupler to which the external matching element is added, according to an embodiment.

FIG. 17 is a graph of an isolation characteristic of the directional coupler to which the external matching element is added, according to an embodiment.

After the external matching element 830 is connected to the first terminal port (e.g., the first terminal port P3 of FIG. 3) of the directional coupler (e.g., the directional coupler 800 of FIG. 14), and the isolation characteristic can be ascertained.

Graphs in which, for example, after a series 47 nH as the third external matching element 830 is connected to the first terminal port (e.g., the first terminal port P3 of FIG. 3) of the directional coupler (e.g., the directional coupler 800 of FIG. 14), the isolation performance is exhibited may be illustrated in FIG. 17 by C1, C2, C3, and C4. An RF signal passing the RF input port (e.g., the RF input port P1 of FIG. 3) and the RF output port (e.g., the RF output port P4 of FIG. 3) in the range of various frequencies may be indicated by the graph C1. A coupling signal extracted between the RF input port (e.g., the RF input port P1 of FIG. 3) and the first coupling port (e.g., the first coupling port P2 of FIG. 3) in the range of various frequencies may be indicated by the graph C2. A coupling signal extracted between the RF input port (e.g., the RF input port P1 of FIG. 3) and the second coupling port (e.g., the first coupling port P5 of FIG. 3) in the range of various frequencies may be indicated by the graph C3. A coupling signal extracted between the RF input port (e.g., the RF input port P1 of FIG. 3) and the first terminal port (e.g., the first terminal port P3 of FIG. 3) in the range of various frequencies may be indicated by the graph C4. Referring to FIG. 17, it can be ascertained that, even in a case where the external matching element 830 is added to the terminal port (e.g., the first terminal port P3 of FIG. 3) of the directional coupler (e.g., the directional coupler 800 of FIG. 14), the directional coupler can have an isolation having a lower value in a wider frequency range as in the embodiment (e.g., the embodiment illustrated in FIG. 16) in which the external matching element is added to the coupling port. The directional coupler 800 according to the embodiment illustrated in FIG. 17 can have isolation of about −55 dB in a frequency band around 0 MHz and an isolation of about −75 dB in a frequency band around 2000 MHz.

It can be ascertained that the external matching element 810 is additionally connected to the first coupling port P2, and thereby the isolation is improved.

The external matching element (e.g., the external matching elements 810, 820, 830, and 840 of FIG. 14) are additionally included in the directional coupler 800, the coupling and the isolation of the directional coupler 800 can be improved.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

A directional coupler (e.g., a directional coupler 400 of FIG. 4) may include: a first layer (e.g., a first layer 410 of FIG. 4) that includes at least one of conductive portions (e.g., conductive portions 411*a* and 411*b* of FIG. 4); a second layer (e.g., a second layer 420 of FIG. 4) that is disposed adjacent to the first layer in a first direction and includes at least one of conductive plates (e.g., conductive plates 424 and 426 of FIG. 4) that overlap the conductive portions of the first layer; a third layer (e.g., a third layer 440 of FIG. 4) that is disposed adjacent to the second layer in the first direction and includes at least one of RF signal transmission lines (e.g., RF signal transmission lines 444 and 446 of FIG. 4); a fourth layer (e.g., a fourth layer 450 of FIG. 4) that is disposed adjacent to the third layer in the first direction and includes conductive lines (e.g., conductive lines of FIG. 4) that are each wound with at least one turn; and conductive vias (e.g., conductive vias 425 and 427 of FIG. 4) that electrically connect the at least one conductive plates of the second layer and the conductive lines of the fourth layer which are each wound with at least one turn, wherein the first layer, the second layer, the third layer, and the fourth layer may form at least a part of a printed circuit board.

The directional coupler may further include a spacer layer (e.g., a spacer layer 430 of FIG. 4) that is disposed between the second layer and the third layer and includes at least one opening (e.g., an opening 433 of FIG. 4).

The at least one opening may be provided for coupling of at least a part between the conductive plates and the RF signal transmission lines.

The directional coupler may include a plurality of spacer layers (e.g., a plurality of spacer layers 730*a*, 730*b* and 730*c* of FIG. 12).

The directional coupler may include a fifth layer (e.g., a fifth layer 560 of FIG. 7) that is disposed adjacent to the fourth layer and has conductive lines that are electrically connected to the conductive lines, each of which is wound with at least one turn.

The directional coupler may further include a first ground layer (e.g., a first ground layer 670 of FIG. 10) that is disposed adjacent to the first layer in a second direction that is opposite to the first direction.

The directional coupler may further include a second ground layer (e.g., a second ground layer 680 of FIG. 10) that is disposed adjacent to the fifth layer in the first direction.

The conductive vias of the directional coupler may be formed to pass through the second layer, the third layer, and the fourth layer and to be electrically disconnected from the RF signal transmission lines of the third layer.

In the second, third, and fourth layers of the directional coupler, the opening may include a first opening region (e.g., in the case of the second layer, a first opening region 423*a* of the second layer of FIG. 4) through which the conductive vias pass, and a second opening region (e.g., in the case of the second layer, a second opening region 423*b* of the second layer of FIG. 4) that is formed at a position corresponding to at least a part of the conductive plates.

In the directional coupler, the conductive plates of the second layer may be formed as conductive plates having a specified area to realize a capacitor, and the conductive lines of the fourth layer may be wound with the number of specified turns to realize an inductor.

When the directional coupler corresponds to a bi-directional coupler, at least some of components included in the bi-directional coupler may be formed symmetrically with respect to a virtual line drawn in one direction in some of the layers.

When the directional coupler corresponds to a bi-directional coupler, the conductive plates of the second layer may include a first conductive plate having a specified area to realize a first capacitor, and a second conductive plate having a specified area to realize a second capacitor, and the conductive lines of the fourth layer may include a first inductor part that is wound with the number of specified turns to realize a first inductor and a second inductor part that is wound with the number of specified turns to realize a second inductor.

In the directional coupler, an end of one of the RF signal transmission lines of the third layer may form an RF input port (e.g., an RF input port P1 of FIG. 3), and an end of the other of the RF signal transmission line of the third layer may form an RF output port (e.g., an RF output port P4 of FIG. 3). At least one end of the conductive line of the fourth layer may form at least one of at least one terminal port (e.g., a terminal port P3 and/or P6 of FIG. 3) or at least one coupling port (e.g., a coupling port P2 and/or P5 of FIG. 3).

In the directional coupler, an external matching element (e.g., an external matching element 810, 820, 830 or 840 of FIG. 14) may be additionally connected to at least one of the at least one terminal port and the at least one coupling port.

An electronic device (e.g., an electronic device 101 of FIG. 1) may include: at least one board; at least one antenna (e.g., an antenna module 197 of FIG. 1); a transceiver (e.g., a transceiver 221 of FIG. 2); a directional coupler (e.g., a directional coupler 230 of FIG. 2 or a directional coupler 400 of FIG. 4) that extracts at least some of signals output from the at least one antenna and transmits a coupling signal to the transceiver; a processor (e.g., a processor 240 of FIG. 4); and a memory (e.g., a memory 250 of FIG. 4) that is operatively connected to the processor, wherein the directional coupler may include: a first layer (e.g., a first layer 410 of FIG. 4) that includes at least one of conductive portions (e.g., conductive portions 411*a* and 411*b* of FIG. 4); a second layer (e.g., a second layer 420 of FIG. 4) that is disposed adjacent to the first layer in a first direction and includes at least one of conductive plates (e.g., conductive plates 424 and 426 of FIG. 4) that are parallel to the conductive portions of the first layer; a third layer (e.g., a third layer 440 of FIG. 4) that is disposed adjacent to the second layer in the first direction and includes at least one of RF signal transmission lines (e.g., RF signal transmission lines 444 and 446 of FIG. 4); a fourth layer (e.g., a fourth layer 450 of FIG. 4) that is disposed adjacent to the third layer in the first direction and includes conductive lines (e.g., conductive lines of FIG. 4) that are each wound with at least one turn; and at least one of conductive vias that electrically connect the at least one of the conductive plates of the second layer and the conductive lines of the fourth layer which are each wound with at least one turn, and wherein the first layer, the second layer, the third layer, and the fourth layer may be embedded in the at least one board.

The electronic device may further include a spacer layer (e.g., a spacer layer 430 of FIG. 4) that is disposed between the second layer and the third layer and includes at least one opening.

At least some of the second layer, the third layer, and the fourth layer may be formed symmetrically with respect to a virtual line drawn in one direction.

The conductive plates of the second layer may be formed as conductive plates having a pre-specified area to realize a capacitor, and the conductive lines of the fourth layer may be wound with the number of pre-specified turns to realize an inductor.

The conductive plates of the second layer may include a first conductive plate having a specified area to realize a first capacitor, and a second conductive plate having a specified area to realize a second capacitor, and the conductive lines of the fourth layer may include a first inductor part that is wound with the number of specified turns to realize a first inductor and a second inductor part that is wound with the number of specified turns to realize a second inductor.

In the directional coupler, an end of one of the RF signal transmission lines of the third layer may form an RF input port (e.g., an RF input port P1 of FIG. 3), and an end of the other of the RF signal transmission lines of the third layer may form an RF output port (e.g., an RF output port P4 of FIG. 3). At least one end of the conductive lines of the fourth layer may form at least one of at least one terminal port (e.g., a terminal port P3 and/or P6 of FIG. 3) or at least one coupling port (e.g., a coupling port P2 and/or P5 of FIG. 3). An external matching element may be additionally connected to at least one of the at least one terminal port and the at least one coupling port.

According to various embodiments disclosed herein, a printed circuit board may include: a first layer (e.g., a first layer 410 of FIG. 4) that includes at least one of conductive portions (e.g., conductive portions 411a and 411b of FIG. 4); a second layer (e.g., a second layer 420 of FIG. 4) that is disposed adjacent to the first layer in a first direction and includes at least one of conductive plates (e.g., conductive plates 424 and 426 of FIG. 4) that are parallel to the conductive portions of the first layer; a third layer (e.g., a third layer 430 of FIG. 4) that is disposed adjacent to the second layer in the first direction and includes at least one of RF signal transmission lines (e.g., RF signal transmission lines 444 and 446 of FIG. 4); a fourth layer (e.g., a fourth layer 450 of FIG. 4) that is disposed adjacent to the third layer in the first direction and includes conductive lines (e.g., conductive lines of FIG. 4) that are each wound with at least one turn; and at least one of conductive vias that electrically connect the at least one conductive plates of the second layer and the conductive lines of the fourth layer which are each wound with at least one turn.

The printed circuit board may further include a spacer layer that is disposed between the second layer and the third layer and includes at least one opening.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. A directional coupler comprising:
a first layer configured to include at least one conductive portion;
a second layer disposed adjacent to the first layer in a first direction and configured to include at least one conductive plate that overlaps the at least one conductive portion of the first layer, wherein the second layer includes an opening region;
a third layer disposed adjacent to the second layer in the first direction and configured to include at least one RF signal transmission line;
a fourth layer disposed adjacent to the third layer in the first direction and configured to include a conductive line that is wound with at least one turn; and
at least one conductive via configured to electrically connect the at least one conductive plate of the second layer and the conductive line of the fourth layer which is wound with at least one turn,
wherein the first layer, the second layer, the third layer, and the fourth layer are embedded in a printed circuit board so that the directional coupler is configured to form at least a part of the printed circuit board.

2. The directional coupler of claim 1, further comprising a spacer layer disposed between the second layer and the third layer and configured to include at least one opening.

3. The directional coupler of claim 2, wherein a plurality of spacer layers including the spacer layer is disposed between the second layer and the third layer.

4. The directional coupler of claim 1, further comprising a first ground layer disposed adjacent to the first layer in a second direction that is opposite to the first direction and electrically connected to the first layer.

5. The directional coupler of claim 1, further comprising a fifth layer configured having conductive lines that are electrically connected to the conductive line formed at the fourth layer.

6. The directional coupler of claim 5, further comprising a second ground layer disposed adjacent to the fifth layer in the first direction and electrically connected to the fifth layer.

7. The directional coupler of claim 1, wherein the conductive via is formed to pass through the second layer, the third layer, and the fourth layer and is electrically disconnected from the RF signal transmission line of the third layer.

8. The directional coupler of claim 1, wherein:
each of the second layer, the third layer, and the fourth layer include an opening; and
the openings including a first opening region through which the conductive via passes, and a second opening region that is formed at a position corresponding to at least a part of the conductive plate.

9. The directional coupler of claim 1, wherein the conductive plate of the second layer is formed as a conductive plate having a specified area to realize a capacitor, and the conductive line of the fourth layer is wound with the number of specified turns to realize an inductor.

10. The directional coupler of claim 1, wherein, when the directional coupler corresponds to a bi-directional coupler, at least some of the components included in the bi-directional coupler may be formed symmetrically with respect to a virtual line drawn in one direction on some of the layers.

11. The directional coupler of claim 1, wherein:
the conductive plate of the second layer includes a first conductive plate having a specified area to realize a first capacitor, and a second conductive plate having a specified area to realize a second capacitor; and
the conductive lines of the fourth layer include a first inductor part that is wound with the number of specified turns and a second inductor part that is wound with the number of specified turns.

12. The directional coupler of claim 1, wherein:
a first end of the RF signal transmission line of the third layer forms an RF input port, and a second end of the RF signal transmission line of the third layer forms an RF output port; and
at least one end of the conductive line of the fourth layer forms at least one of at least one terminal port or at least one coupling port.

13. The directional coupler of claim 12, wherein at least one passive element is additionally connected to at least one of the at least one terminal port and the at least one coupling port.

14. An electronic device comprising:
at least one board;
at least one antenna;
a transceiver;
a directional coupler configured to extract at least some of signals output from the at least one antenna and to transmit a coupling signal to the transceiver;
a processor; and
a memory operatively connected to the processor,
wherein the directional coupler includes:
a first layer that includes at least one conductive portion;
a second layer that is disposed adjacent to the first layer in a first direction and includes at least one conductive plate that at least partly overlaps the at least one conductive portion of the first layer, wherein the second layer includes an opening region;
a third layer that is disposed adjacent to the second layer in the first direction and includes at least one RF signal transmission line;
a fourth layer that is disposed adjacent to the third layer in the first direction and includes a conductive line that is wound with at least one turn; and
at least one conductive via configured to electrically connect the at least one conductive plate of the second layer and the conductive line of the fourth layer which is wound with at least one turn, and
wherein the first layer, the second layer, the third layer, and the fourth layer are embedded in the at least one board so that the directional coupler is configured to form at least a part of the at least one board.

15. The electronic device of claim 14, further comprising a spacer layer disposed between the second layer and the third layer and configured to include at least one opening.

16. The electronic device of claim 14, wherein at least some of the second layer, the third layer, and the fourth layer are formed symmetrically with respect to a virtual line drawn in one direction.

17. The electronic device of claim 14, wherein:
the conductive plate of the second layer includes a first conductive plate having a specified first area, and a second conductive plate having a specified second area; and
the conductive line of the fourth layer includes a first inductor part that is wound with the number of specified first turns and a second inductor part that is wound with the number of specified second turns.

18. The electronic device of claim 15, wherein:
a first end of the RF signal transmission line of the third layer forms an RF input port, and a second end of the RF signal transmission line of the third layer forms an RF output port;
at least one end of the conductive line of the fourth layer forms at least one of at least one terminal port or at least one coupling port; and
at least one passive element is additionally connected to at least one of the at least one terminal port and the at least one coupling port.

19. A printed circuit board comprising:
a first layer configured to include at least one conductive portion;
a second layer disposed adjacent to the first layer in a first direction and configured to include at least one conductive plate that at least partly overlaps the at least one conductive portion of the first layer, wherein the second layer includes an opening region;
a third layer disposed adjacent to the second layer in the first direction and configured to include at least one RF signal transmission line;
a fourth layer disposed adjacent to the third layer in the first direction and configured to include a conductive line that is wound with at least one turn; and
at least one conductive via configured to electrically connect the at least one conductive plate of the second layer and the conductive line of the fourth layer which is wound with at least one turn,
wherein the first layer, the second layer, the third layer, and the fourth layer are embedded in a printed circuit board.

20. The printed circuit board of claim 19, further comprising a spacer layer disposed between the second layer and the third layer and configured to include at least one opening.

* * * * *